(12) United States Patent
Valley et al.

(10) Patent No.: US 8,902,096 B2
(45) Date of Patent: Dec. 2, 2014

(54) SYSTEMS AND METHODS FOR CONVERTING WIDEBAND SIGNALS INTO THE DIGITAL DOMAIN USING ELECTRONICS OR GUIDED-WAVE OPTICS

(71) Applicant: The Aerospace Corporation, El Segundo, CA (US)

(72) Inventors: George C. Valley, Los Angeles, CA (US); George Sefler, Redondo Beach, CA (US); Thomas Justin Shaw, Reston, VA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 13/830,826

(22) Filed: Mar. 14, 2013

(65) Prior Publication Data

US 2014/0266826 A1    Sep. 18, 2014

(51) Int. Cl.
  *H03M 1/00* (2006.01)
  *H03M 1/12* (2006.01)
(52) U.S. Cl.
  CPC ........................................ *H03M 1/12* (2013.01)
  USPC ........................................... 341/137; 341/155
(58) Field of Classification Search
  USPC .................................................. 341/137, 155
  See application file for complete search history.

(56) References Cited

U.S. PATENT DOCUMENTS

| 4,851,840 | A  | * | 7/1989  | McAulay ...................... 341/137 |
| 6,801,147 | B2 | * | 10/2004 | Thylen et al. ................. 341/137 |
| 8,026,837 | B1 | * | 9/2011  | Valley et al. .................. 341/137 |
| 2011/0234436 | A1 | * | 9/2011 | Bogoni et al. ................ 341/137 |

OTHER PUBLICATIONS

Bortnik et al., *Predistortion technique for RF-photonic generation of high-power ultrawideband arbitrary waveforms*, J. Lightwave Technology, vol. 24, No. 7, 2752-2759 (Jul. 2006).

Candes et al. *Near Optimal Signal Recovery From Random Projections: Universal Encoding Strategies?*, IEEE Trans. on Information Theory, vol. 52, No. 12, 5406-5425 (Dec. 2006) Submitted Oct. 2004, Revised Mar. 2006.

Candes et al., *An Introduction to Compressive Sampling [A sensing/sampling paradigm that goes against the common knowledge in data acquisition]*, IEEE Signal Processing Magazine, vol. 25 No. 2, 21-30, (Mar. 2008).

Chou et al., *Adaptive RF-Photonic Arbitrary Waveform Generator*, IEEE Photonics Technology Letters, vol. 15, No. 4, 581-583 (Apr. 2003).

(Continued)

*Primary Examiner* — Brian Young
(74) *Attorney, Agent, or Firm* — Jones Day; Jaime D. Choi

(57) ABSTRACT

Systems and methods for converting wideband signals into the digital domain are provided herein. The system may include an electronic or guided-wave optic based replicator configured to obtain at least M replicas of a signal applied thereto, and an electronic or guided-wave optic based segmenter configured to segment a signal applied thereto into at least N segments based on time or wavelength. Together, the replicator and the segmenter obtain M×N segment replicas of the received signal. An electronic or guided-wave optic based mixer is configured to multiply the M×N segment replicas by a mixing matrix having dimension M×N and then to form M integrations each of N segment replicas so as to obtain a measurement vector of length M. A signal recovery processor is configured to obtain a digital representation of the received signal based on the measurement vector and the mixing matrix.

20 Claims, 14 Drawing Sheets

(56) References Cited

OTHER PUBLICATIONS

Chou et al., *Photonic bandwidth compression front end for digital oscilloscopes*, submitted to J. Lightwave Technology, vol. 27, No. 22, 5073-5077 (Nov. 15, 2009).

Donoho, David, *Compressed Sensing*, IEEE Trans. on Information Theory, vol. 52, No. 4, 1289-1306 (Apr. 2006) published online Sep. 14, 2004.

Gupta et al., *Power scaling in time stretch analog-to-digital converters*, Proceedings of Avionics, Fiber-Optics and Phototonics and Photonics Technology Conference, AVFOP '09. IEEE, pp. 5-6 (Sep. 22-24, 2009).

Koh et al., "A Millimeter-Wave (40-45 GHz) 16-Element Phased-Array Transmitter in 0.18-μm SiGe BiCMOS Technology," IEEE Journal of Solid-State Circuits, 44(5):1498-1509 (2009).

Lee et al., *Extreme Chirped Pulse Oscillator (XCPO) Using a Theta Cavity Design*, IEEE Photonics Technology Letters, vol. 18, No. 7, 799-801 (Apr. 1, 2006).

Lee et al., *33MHz Repetition Rate Semiconductor Mode-Locked Laser Using eXtreme Chirped Pulse Oscillator*, in Conference on Lasers and Electro-Optics/Quantum Electronics and Laser Science Conference and Photonic Applications Systems Technologies, OSA Technical Digest (CD), 2 pages (Optical Society of America, 2008), paper CTuU7.

Loris, Ignace, *L1 Packv2: A Mathematica package for minimizing an ll-penalized functional,*. 1-17 (Aug. 20, 2008) available at http://adsabs.harvard.edu/abs/2008CoPhC.179..895L.

Min, Byungwook, "SiGe/CMOS Millimeter-Wave Integrated Circuits and Wafer-Scale Packaging for Phased Array Systems," A dissertation submitted in partial fulfillment of the requirements for the degree of Doctor of Philosophy in the University of Michigan (2008).

Mishali et al., *From Theory to Practice: Sub-Nyquist Sampling of Sparse Wideband Analog Signals*, pp. 1-17 (Nov. 10, 2009), available at http://arxiv.orgjabs/0902.4291v3.

Sefler et al., *Holographic Multichannel Radio-Frequency Correlator*, Optical Engineering, vol. 39 No. 1, 260-266 (Jan. 2000).

Sefler et al., *Wide Bandwidth, High Resolution TimeStretch ADC Scalable to Continuous-Time Operation*, Proceedings of Conference on Lasers and Electro-Optics, 2009 and 2009 Conference on Quantum electronics and Laser Science Conference, CLEO/QELS 2009, pp. 1-2 (Jun. 2-4, 2009).

Tropp et al., *Beyond Nyquist: Efficient Sampling of Sparse Bandlimited Signals*, IEEE Transactions on Information Theory, vol. 56, No. 1, 520-544 (Jan. 2010).

Valley, G. C., *Photonic Analog to Digital Converters*, Optics Express, vol. 15 Issue 5, pp. 1955-1982 (Mar. 5, 2007).

Walden, R.H., *Analog-to-digital conversion in the early 21st century*, in wiley Encyclopedia of Computer Science and Engineering, (edited by Benjamin Wah) Hoboken: John Wiley & Sons, Inc., pp. 1-14 (Sep. 9, 2008).

Wei et al., "New Code Families for Fiber-Bragg-Granting-Based-Spectral-Amplitude-Coding Optical CDMA Systems," IEEE Photonic Technology Letters, 13(8):890-892 (2001).

Xiao et al., *Programmable Photonic Microwave Filters With Arbitrary Ultra-Wideband Phase Response*, IEEE Trans. Microwave Theory and Technique, vol. 54, No. 11, 4002-4008 (Nov. 2006).

\* cited by examiner

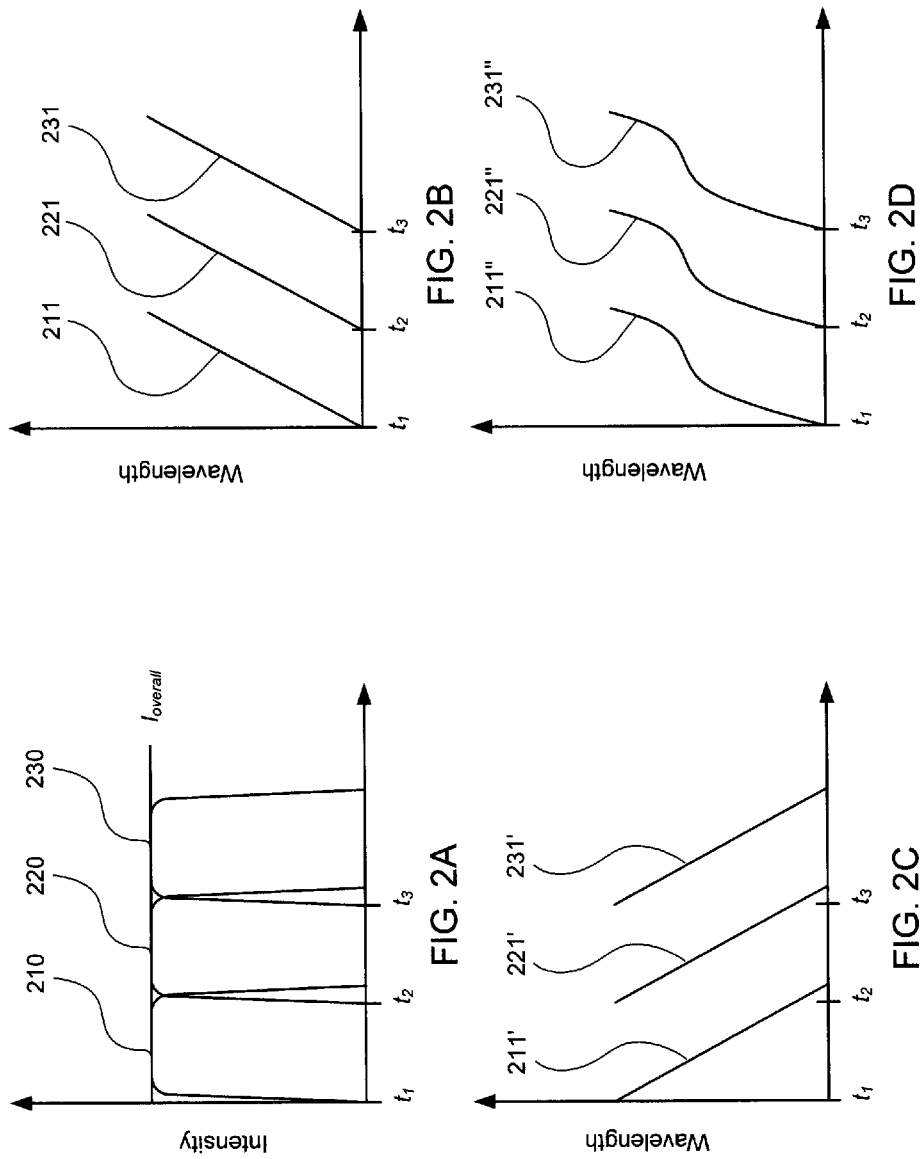

SYSTEMS AND METHODS FOR CONVERTING WIDEBAND SIGNALS INTO THE DIGITAL DOMAIN USING ELECTRONICS OR GUIDED-WAVE OPTICS

FIELD OF THE INVENTION

This application generally relates to systems and methods for converting signals into the digital domain.

BACKGROUND OF THE INVENTION

An analog-to-digital converter (ADC) is a device that converts continuous analog signals to discrete digital numbers. Generally, an ADC samples an input signal at a predetermined sampling rate calculated using the Nyquist-Shannon Sampling Theorem. Under that theorem, perfect reconstruction of a continuous time signal may be obtained if the sampling rate is greater than twice the highest frequency of the signal. Sampling at twice the highest frequency may, however, not be possible, especially for wideband signals or the resolution (effective number of bits) obtained at this rate may not be sufficient. A wideband signal may be defined as a signal operating at a wide range of frequencies, e.g., above 1 GHz. For these reasons, previously-known ADCs may be inadequate to handle wideband applications in, for example, electronic warfare, radar, cognitive radio, signals intelligence, telecommunications, and signal sampling in space. Moreover, previously-known ADCs rely on high-speed, high-power electronics that may be cumbersome, power-hungry, and expensive.

SUMMARY OF THE INVENTION

Embodiments of the present invention provide systems and methods for converting wideband signals into the digital domain using optical-domain processing. Specifically, a received signal, e.g., a wideband analog signal, may be modulated onto an optical field, processed in the optical domain and converted back to the electronic domain so as to convert the received signal into a digital signal using relatively low cost, relatively low data rate, and relatively low power analog-to-digital converters (ADCs). Preferably, such conversion and processing is performed using low-bandwidth electronic or guided-wave optical elements, so as to avoid the need for high-bandwidth electronics as well as free-space optics. The elements of the system suitably may be integrated into a unitary platform.

Under one aspect of the present invention, a system is provided for obtaining a digital representation of a received signal. The system may include an electronic or guided-wave optic based replicator configured to obtain at least M replicas of a signal applied thereto, and an electronic or guided-wave optic based segmenter configured to segment a signal applied thereto into at least N segments based on time or wavelength. Together, the replicator and the segmenter are configured to obtain M×N segment replicas of the received signal. The system further may include an electronic or guided-wave optic based mixer configured to multiply each of the M×N segment replicas by the appropriate coefficients of a mixing matrix having dimension M×N and, after the multiplication, to form M integrations each of N of the segment replicas so as to obtain a measurement vector of length M, as well as a signal recovery processor configured to obtain a digital representation of the received signal based on the measurement vector and the mixing matrix.

In some embodiments, the system further includes a chirped optical source configured to generate a chirped, repetitively pulsed optical signal and an optical modulator configured to modulate the optical signal based on the received signal, e.g., a received RF signal.

The segmenter may, for example, include a guided-wave optic based wavelength division demultiplexer that has dimension 1×N and is configured to receive the modulated optical signal and to generate N segments of the modulated optical signal based on wavelength.

In some embodiments, the replicator may include N guided-wave optic based splitters, each having dimension 1×M, and each being configured to receive one of the N segments of the optical signal from the wavelength division demultiplexer and to output M replicas of that segment. The mixer may include M×N guided-wave optic based attenuators, each configured to receive one of the M×N segment replicas from a corresponding splitter and to multiply that segment replica by an element of the mixing matrix by either substantially transmitting that segment replica or by substantially reflecting or absorbing that segment replica. The mixer further may include M wavelength division multiplexers, each having dimension N×1, and each being configured to receive and to integrate N of the segment replicas from N corresponding attenuators and to output a corresponding one of the M elements of the measurement vector. The signal recovery processor may include M photodetectors, each configured to receive one of the M elements of the measurement vector from a corresponding wavelength division multiplexer and to output an electronic representation of that element; as well as M analog-to-digital converters, each configured to receive one of the electronic representations of one of the M elements of the measurement vector from a corresponding photodetector and to output a digital representation of that element.

In other embodiments, the replicator may include N photodiodes, each configured to receive one of the N segments of the optical signal from the wavelength division demultiplexer and to output an electronic representation of the segment. The replicator further may include N electronic based splitters, each configured to receive one of the electronic representations of the segments and to output M replicas of that electronic representation of the segment. The mixer may include an electronic based switch configured to multiply each of the M×N segment replicas by a corresponding element of the mixing matrix by either substantially transmitting or substantially blocking that segment replica. The electronic switch may include M output ports, each output port receiving and integrating N of the segment replicas following multiplication and outputting one of the M elements of the measurement vector. The signal recovery processor may include M analog-to-digital converters, each configured to receive one of the M elements of the measurement vector from a corresponding one of the M output ports and to output a digital representation of that element.

In still other embodiments, the replicator may include a guided-wave optic based splitter having dimension 1×M and being configured to receive the modulated optical signal and to generate M replicas of the modulated optical signal. The segmenter may include M×N fiber Bragg grating (FBGs) arranged in M units each having N FBGs, each unit being configured to receive one of the M replicas of the modulated optical signal. Each FBG in the unit may be tuned to a different wavelength of light than each other FBG in the unit so as to segment the received one of the M replicas into N segment replicas based on wavelength. The mixer may include a first subset of the M×N FBGs that is configured to substantially reflect the wavelengths to which those FBGs are tuned and a second subset of the N×M FBGs that is configured to substantially transmit the wavelengths to which those FBGs are tuned so as to multiply the M×N segment replicas by the mixing matrix.

The mixer further may include 2M photodetectors, a pair of the photodetectors being associated with each of the M units. A first photodetector of each pair may be configured to receive light transmitted by the FBGs of the unit and to convert the received light into a first electronic signal, while a second photodiode of the pair may be configured to receive light reflected by the FBGs of the unit and to convert the received light into a second electronic signal. The mixer further may include M electronic based integration circuits, each associated with a corresponding one of the M units and configured to receive the first and second electronic signals from the corresponding pair of photodetectors associated with that unit and to output a corresponding one of the M elements of the measurement vector based on the first and second electronic signals. The signal recovery processor may include M analog-to-digital converters, each associated with one of the M units and configured to receive a corresponding one of the M elements of the measurement vector from the integration circuit associated with that unit and to output a digital representation of that element.

Alternatively, the mixer may include M photodetectors, each associated with a corresponding one of the M units and configured to receive light transmitted by or reflected by the FBGs of the unit and to convert the received light into a corresponding one of the M elements of the measurement vector. The signal recovery processor may include M analog-to-digital converters, each associated with a corresponding one of the M units and configured to receive the corresponding element of the measurement vector from the photodetector associated with that unit and to output a digital representation of that element.

The chirp of the optical source may be selected so as to offset timing delays generated by the M×N FBGs. Alternatively, the mixer may include additional FBGs configured to offset timing delays generated by the M×N FBGs.

The received signal may include an analog signal, such as an analog radio-frequency signal. Alternatively, the received signal may include an optical digital signal.

Under another aspect of the present invention, a method is provided for obtaining a digital representation of a received signal. The method may include replicating and segmenting the applied signal based on time or wavelength to obtain M×N segmented replicas of the signal with an electronic or guided-wave optic based replicator and an electronic or guided-wave optic based segmenter. The method further may include multiplying the M×N segmented replicas by a mixing matrix having dimension M×N with an electronic or guided-wave optic based mixer and, after the multiplication, forming M integrations each of N of the segment replicas so as to obtain a measurement vector of length M with the mixer. A digital representation of the received signal then may be obtained based on the measurement vector and the mixing matrix.

BRIEF DESCRIPTION OF THE DRAWINGS

FIG. 2A is a plot illustrating the temporal variations in intensity of three exemplary chirped repetitively pulsed optical signals that may be generated by a chirped optical source.

FIG. 2B-2D are plots illustrating temporal variations in wavelength of three exemplary chirped repetitively pulsed optical signals that may be generated by a chirped optical source, e.g., the temporal wavelength variations of the three chirped repetitively pulsed optical signals illustrated in FIG. 2A.

DETAILED DESCRIPTION

Figure 1A:
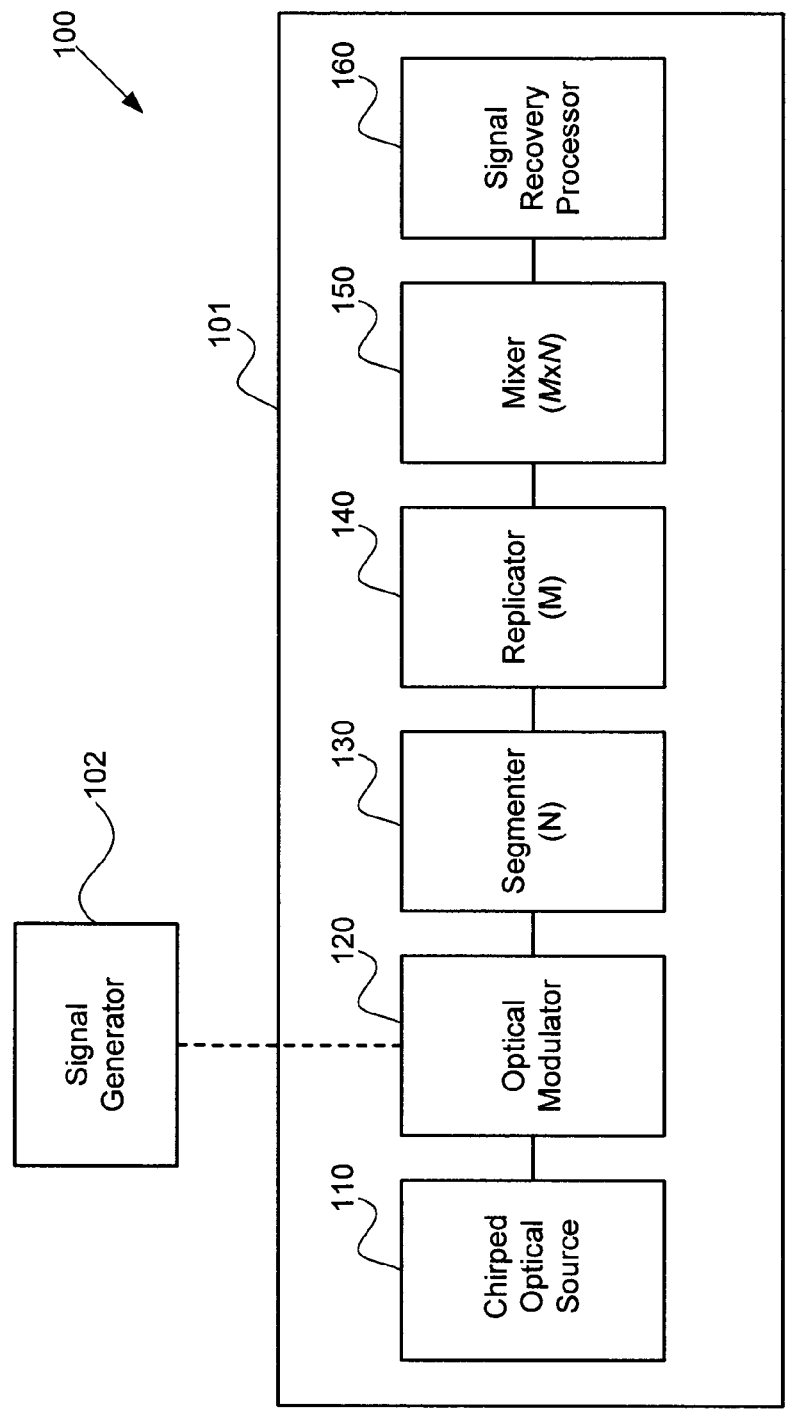
FIGS. 1A-1D schematically illustrate exemplary devices for obtaining a digital representation of a wideband signal using electronic or guided-wave optic based components, according to some embodiments of the present invention.

Embodiments of the present invention include systems and methods for obtaining a digital representation of a received signal using electronics (particularly low-bandwidth electronics) or guided wave optics, or a combination thereof. The signal may be, for example, a digital or analog radio-frequency (RF) signal, that is converted into the optical domain, e.g., imposed on a repetitively chirped optical signal using a modulator, or may be an optical digital signal. The received signal then may be segmented based on time or wavelength, as well as replicated, so as to obtain M×N segment replicas of the signal, which may be in the optical domain or in the electronic domain. The segment replicas then may be mixed in the optical domain or in the electronic domain as appropriate by multiplying them by corresponding elements of a mixing matrix such as known in the art of compressive sensing. For example, the transmitted intensities or polarities of the segment replicas in the optical or electronic domain may be varied based on corresponding elements of the mixing matrix. Thereafter, M integrations each of N of the segment replicas may be formed so as to obtain a measurement vector of length M. A signal recovery processor then may obtain the digital representation of the received signal based on the measurement vector and the mixing matrix using techniques known in the art of compressive sensing.

Previously-known signal processing techniques may rely on high-speed, high power electronics to obtain a digital representation of a wideband signal. Alternatively, U.S. Pat. No. 8,026,837 to Valley et al. utilizes free-space optical-based mixing to obtain a digital representation of a wideband signal. In comparison, in accordance with the principles of the present invention, relatively low-speed, low power electronics or guided-wave optics, or a combination thereof may be used to obtain a digital representation of a wideband signal. In particular, the present systems and methods may be used to generate a defined number of segment replicas of a signal, and then to impose a mixing matrix on the segment replicas so as to permit the received signal to be converted into a digital signal, preferably using relatively low cost, relatively low bandwidth, and relatively low power analog-to-digital converters (ADCs) as may be readily commercially available. The systems and methods disclosed herein may sample the received signal at a sampling rate at least M times greater than the sampling rate of a given ADC used therein, where M is the number of replicas formed of the received signal. This functionality may be especially important for converting wideband signals, e.g., signals operating at frequencies above 1 GHz, or above 50 GHz, or above 100 GHz, or above 500 GHz, where the power and speed limitations of previously known ADCs may have limited their use. Additionally, the use of electronic or guided-wave optic based optical mixing techniques may provide enhanced stability and performance as compared to free-space optical mixing techniques such as described in U.S. Pat. No. 8,026,837, the entire contents of which are incorporated by reference herein.

First, an overview of exemplary systems for obtaining digital representations of signals will be described, along with exemplary signals that may be formed therein. Then, several specific examples of suitable systems will be described. Then, an exemplary method for obtaining digital representations of signals will be described.

Figure 1B:
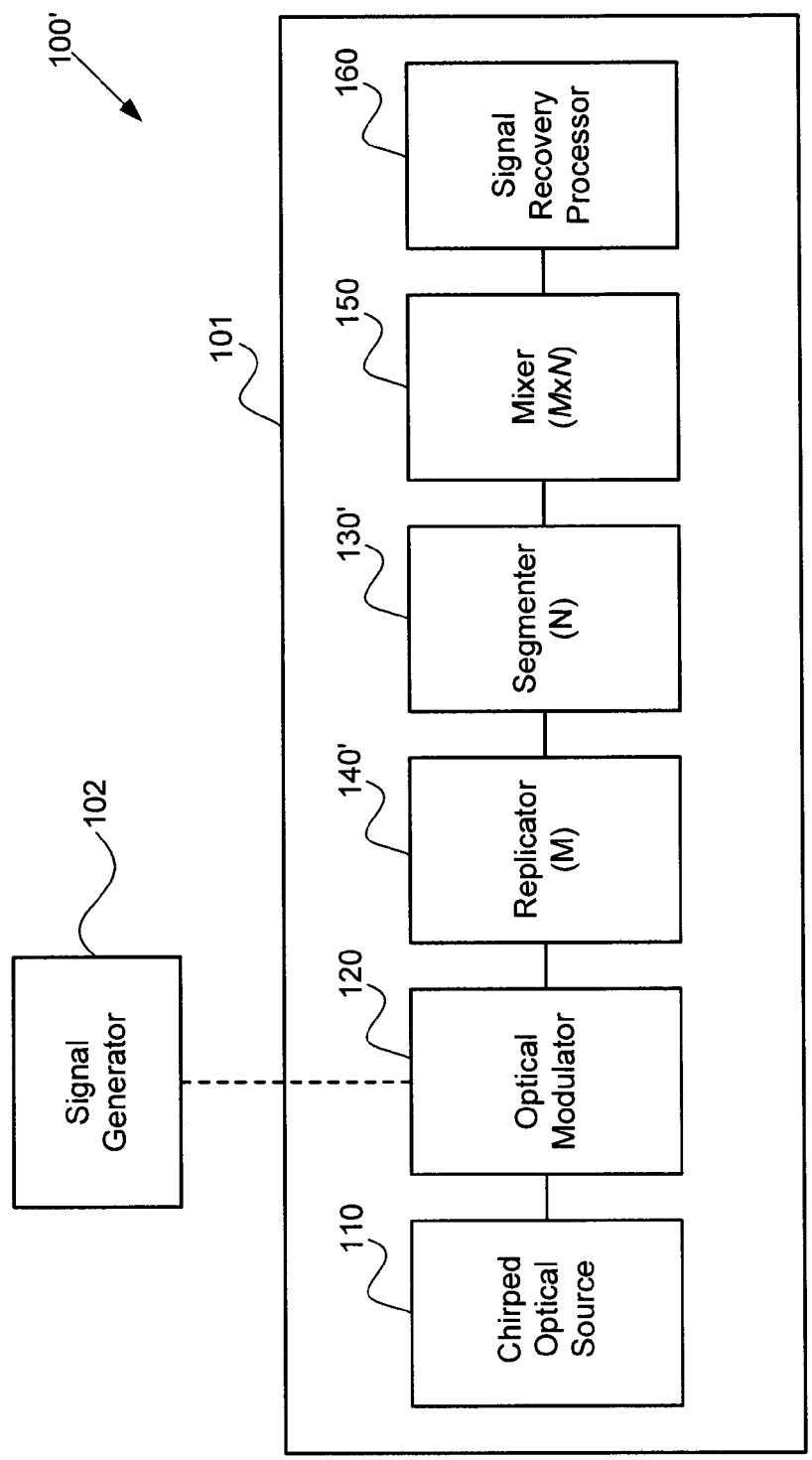
Figure 1C:
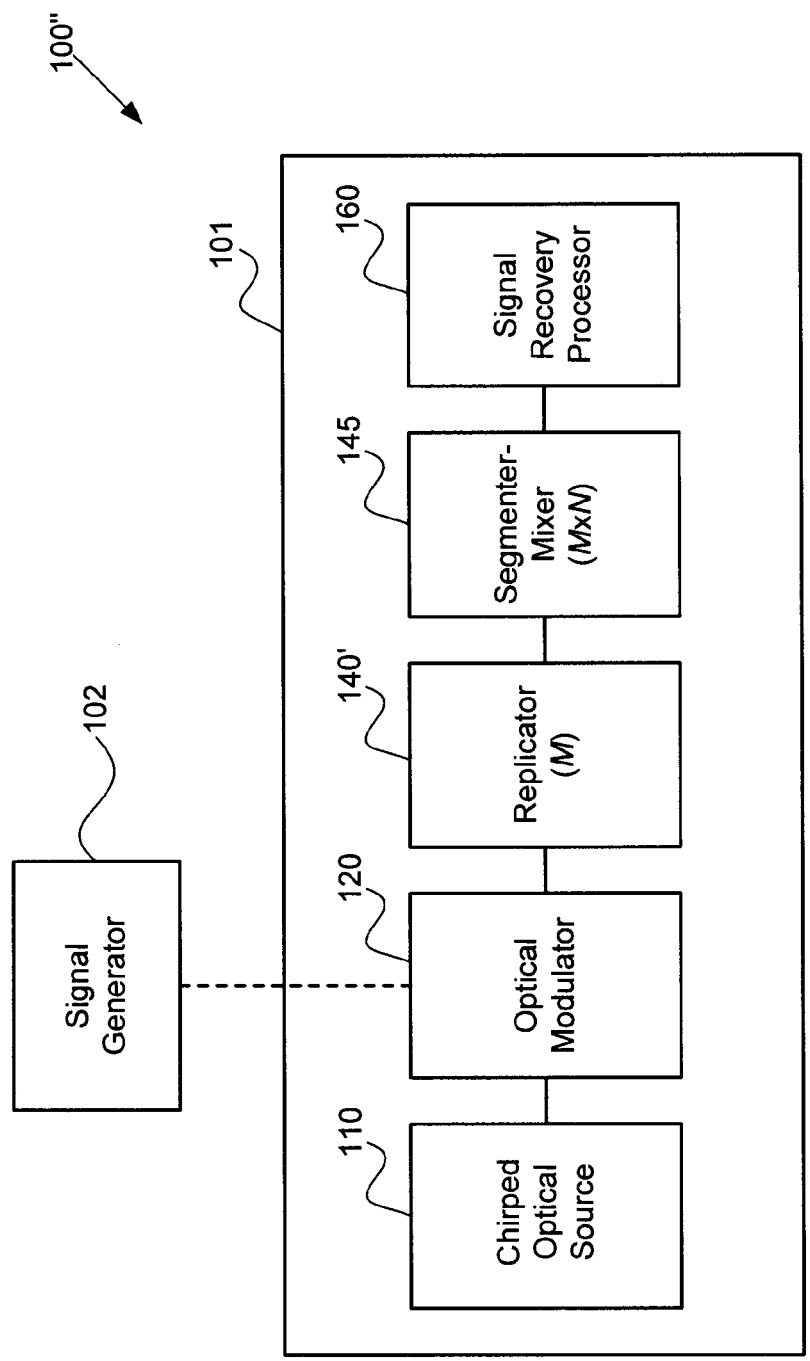
Figure 1D:
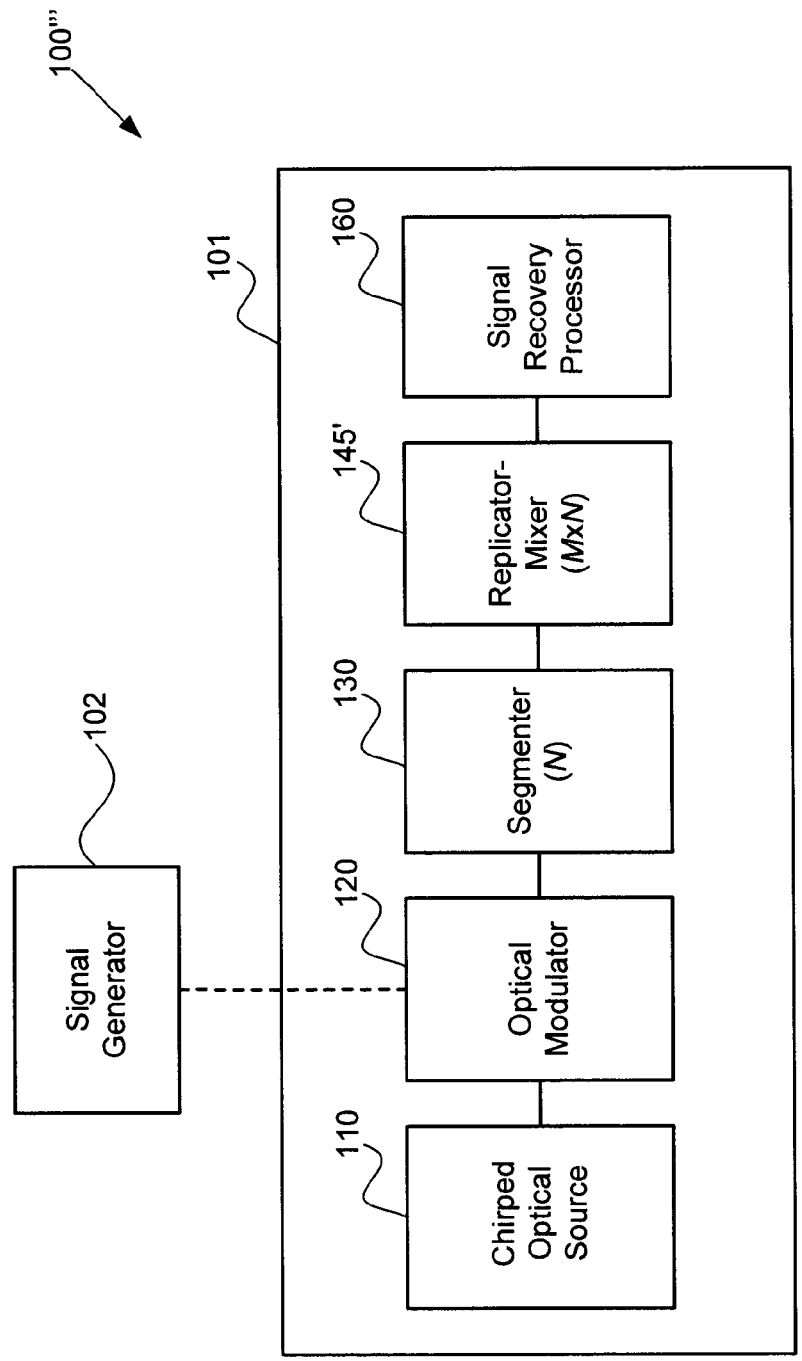

FIG. 1A schematically illustrates a first exemplary system 100 for obtaining a digital representation of a received signal using electronics or guided-wave optics, or a combination thereof, according to some embodiments of the present invention. System 100 includes chirped optical source 110, optical modulator 120 coupled to signal generator 102, segmenter 130, replicator 140, mixer 150, and signal recovery processor 160. In some embodiments, system 100 includes housing 101 configured to hold at least chirped optical source 110, optical modulator 120, segmenter 130, replicator 140, mixer 150, and signal recovery processor 160 as illustrated in FIG. 1A. Alternative arrangements of segmenter 130, replicator 140, and mixer 150 are described further below with reference to FIGS. 1B-1D. Preferably, at least segmenter 130, replicator 140 and mixer 150 are integrated into a unitary device so as to provide enhanced stability and simplicity of fabrication. For example, segmenter 130, replicator 140 and mixer 150 may be disposed on a common substrate (such as a silicon, silica, or lithium niobate wafer) with one another. Segmenter 130, replicator 140, and mixer 150 may be in operable communication with one another via guided-wave optical elements, such as waveguides or optical fibers, or via electrical elements, such as conductive pathways, that also are disposed on the common substrate. In other embodiments, system 100 includes more than one housing or more than one substrate (not shown), each housing or substrate configured to hold at least one structure in system 100.

Chirped optical source 110 illustrated in FIG. 1A may be configured to generate a chirped, repetitively pulsed optical signal. As used herein, a chirped, repetitively pulsed optical signal means a sequence of chirped optical pulses that together have a relatively constant intensity as a function of time and have periodic temporal wavelength variations. FIG. 2A is a plot illustrating the temporal variations in intensity of three exemplary chirped pulses that may be generated by chirped optical source 110 and together may form a chirped, repetitively pulsed optical signal that has a substantially continuous overall intensity in time, as represented by $I_{overall}$. FIG. 2A illustrates three chirped pulses 210, 220, 230 within the signal that begin at times $t_1$, $t_2$, and $t_3$, respectively. After a chirped pulse begins, its intensity increases over time until the intensity levels off at a plateau, e.g., at $I_{overall}$. Chirped pulses 210, 220, 230 may have substantially the same energy as one another and may overlap slightly in the temporal domain. For example, the intensity of pulse 210 begins to decrease after time $t_2$, when pulse 220 begins. Pulses 210 and 220 overlap slightly after time $t_2$, after which the intensity of pulse 210 decreases to zero and the intensity of pulse 220 increases to $I_{overall}$. Preferably, when the pulses overlap, the sum of their intensities is approximately equal to $I_{overall}$. As used herein, the terms "approximately" and "about" mean within 10% of the stated value.

FIG. 2B is a plot illustrating the temporal variations in wavelength of three exemplary chirped pulses that may be generated by chirped optical source 110, e.g., the temporal wavelength variations of the three chirped pulses 210, 220, 230 illustrated in FIG. 2A. For example, chirped pulses 210, 220, 230 respectively may have temporal wavelength profiles 211, 221, 231 which, as illustrated in FIG. 2B, may begin at times $t_1$, $t_2$, $t_3$ and overlap slightly with one another in the temporal domain. To generate temporal wavelength profiles 211, 221, 231, an optical component such as dispersion compensating fiber or a chirped grating, e.g., a chirped fiber Bragg grating (CFBG), may be arranged so that the short-wavelength component of the optical pulse travels a shorter path than does the long-wavelength component. After transmission through or reflection from the grating, the optical pulse becomes linearly positively chirped, that is, the long-wavelength component lags behind the short-wavelength component in time in a linear manner.

FIG. 2C is a plot illustrating the temporal variations in wavelength of three exemplary linearly negatively chirped pulses that may be generated by chirped optical source 110, e.g., the temporal wavelength variations of the three pulses 210, 220, 230 illustrated in FIG. 2A. In this example, chirped pulses 210, 220, 230 respectively may have temporal wavelength profiles 211', 221', 231' which, as illustrated in FIG. 2C, may begin at times $t_1$, $t_2$, $t_3$ and overlap slightly with one another in the temporal domain. To generate temporal wavelength profiles 211', 221', 231', an optical component such as dispersion compensating fiber, a chirped grating, e.g., a CFBG, may be arranged so that the long-wavelength component of the optical pulse travels a shorter path than does the short-wavelength component. After transmission through or reflection from the grating, the optical pulse becomes negatively chirped, that is, the short-wavelength component lags behind the long-wavelength component in time in a linear manner.

FIG. 2D is a plot illustrating the temporal variations in wavelength of three exemplary nonlinearly positively chirped pulses that may be generated by chirped optical source 110, e.g., the temporal wavelength variations of the three pulses 210, 220, 230 illustrated in FIG. 2A. In this example, chirped pulses 210, 220, 230 respectively may have temporal wavelength profiles 211", 221", 231" which, as illustrated in FIG. 2D, are positively chirped in a manner analogous to that illustrated in FIG. 2B, but have wavelengths that vary nonlinearly with time. Optical components such as CFBGs for either positively or negatively nonlinearly chirping optical pulses are known.

Referring again to FIG. 1A, chirped optical source 110 may include a suitably pulsed laser, such as a mode-locked laser, fiber laser, titanium-doped sapphire (Ti:Sapphire) solid-state laser, diode laser, or dye laser, or any other suitable optical source. In some embodiments, the laser may be configured so as to generate a chirped, repetitively pulsed optical signal without the need for an additional optical component. Alternatively, a separate optical component may be provided for chirping a pulse generated by a laser or other suitable optical source. Such an optical component preferably is a guided-wave optical component, and may include, for example, a grating such as a chirped FBG, a dispersion compensating fiber (DCF), or a standard optical fiber. In embodiments in which chirped optical source 110 is a pulsed laser, the laser may be transform-limited, so as to produce ultrafast pulses (e.g., 1 picosecond at full width at half maximum (FWHM) or less) at a high bandwidth (e.g., 10 nm at FWHM or more), and the optical component may be configured to temporally disperse the bandwidth of those pulses such that the pulses temporally overlap with one another, resulting in a substantially uniform overall intensity $I_{overall}$ such as illustrated in FIG. 2A. The pulsed laser preferably has a repetition rate of at least 1 MHz, or at least 10 MHz, or at least 100 MHz, or at least 1 GHz, resulting in a suitable interpulse period (time difference between $t_2$ and $t_1$, and between $t_3$ and $t_2$). For example, a pulsed laser with a repetition rate of about 100 MHz has an interpulse period of about 10 ns. In some embodiments, chirped optical source 110 is a femtosecond (fs) class laser configured to generate laser pulses having a FWHM in the range of 1 fs to 1000 fs, e.g., between 10 fs to 100 fs at FWHM, associated with a chirped FBG configured to positively linearly or negatively linearly chirp and temporally disperse the pulses in a manner analogous to that illustrated in FIGS. 2A-2C.

In one illustrative embodiment, chirped optical source 110 may be a theta laser such as disclosed in Shinwook Lee et al., *Extreme Chirped Pulse Oscillator (XCPO) Using a Theta Cavity Design*, IEEE Photonics Technology Letters, Vol. 18, No. 7, 799-801 (Apr. 1, 2006), the entire contents of which are incorporated by reference herein. The theta laser disclosed in Lee includes two optical circulators, an intensity modulator, an output coupler, a bandpass filter, a polarization controller, a semiconductor optical amplifier, an electric comb generator, and chirped FBG. The theta laser may be used to generate a sequence of chirped optical pulses.

Signal generator 102 is coupled to optical modulator 120, and may be configured to generate a signal such as an analog radio-frequency (RF) or digital RF signal. Signal generator 102 may be any device capable of generating a signal, which may include receiving a signal from another component. For example, signal generator 102 may include an antenna configured to receive a remotely generated signal and to provide that signal to optical modulator 120, e.g., via a wired or wireless signaling pathway (not illustrated). Signal generator 102 is suitably coupled to optical modulator such that modulator 120 may impose the generated signal upon the chirped, repetitively pulsed optical signal as described in greater detail below. Signal generator 102 need not necessarily be considered to be part of system 100, and indeed may be remote from system 100.

The signal generated by signal generator 102 may be wideband, e.g., may have a bandwidth of 1 GHz or greater, and may be analog, and the signal's characteristics (e.g., modulation format) and the information content of that signal may be unknown. In a particularly preferred embodiment, signal generator 102 generates an analog RF signal. The analog signal may be "sparse" under a known transformation, e.g., a Fourier or wavelet transformation. In the frequency domain, a signal is defined to be "sparse" if it consists of a relatively small number of narrowband transmissions spread across a relatively wide spectrum range. A sparse signal may be represented by a vector, e.g., a vector having dimension N×1, having a relatively small number of nonzero elements.

Figure 3:
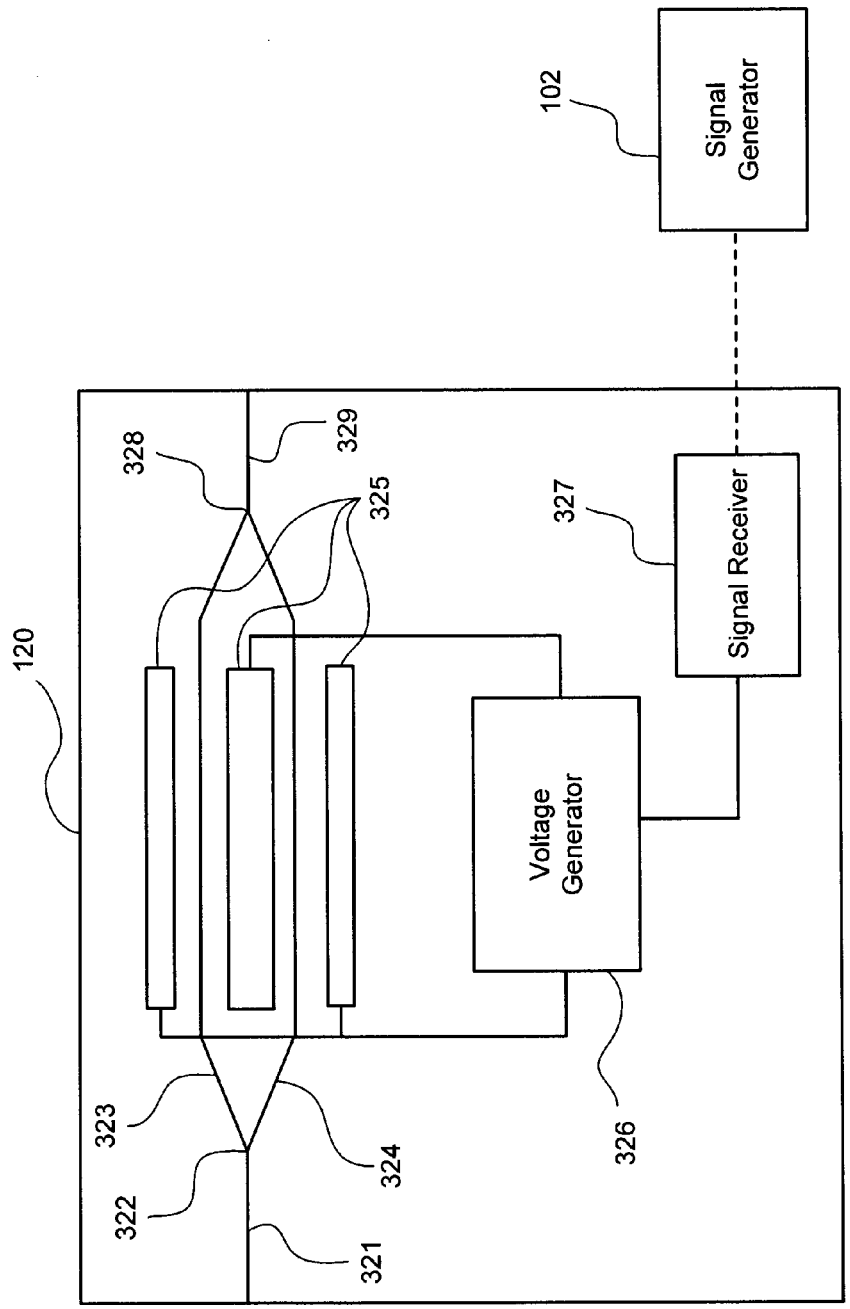
FIG. 3 schematically illustrates an exemplary optical modulator that is an intensity modulator configured to impose an analog signal on the chirped repetitively pulsed optical signal of FIGS. 2A-2D, according to some embodiments of the invention.

Optical modulator 120 may be configured to impose the received signal, e.g., an RF analog signal, on the chirped, repetitively pulsed optical signal generated by chirped optical source 110. For example, FIG. 3 schematically illustrates an exemplary optical modulator 120 that is based on guided-wave optics and is configured to receive a signal from signal generator 102, and to impose the received signal on the optical signal by modulating the intensity of the optical signal, according to some embodiments of the invention. Optical modulator 120 illustrated in FIG. 3 includes input optical fiber or waveguide 321, electrodes 325, voltage generator 326, signal receiver 327, and output optical fiber or waveguide 329. A chirped, repetitively pulsed optical signal from chirped optical source 110 is introduced to optical modulator 120 through input optical fiber or waveguide 321. Junction 322 divides that optical signal into two portions and respectively guides the portions into sections 323 and 324, each of which may be defined with guided-wave optics such as an optical fiber or waveguide. Electrodes 325 are positioned on either side of sections 323, 324. Voltage generator 326 may be programmed to independently apply voltages to different pairs of electrodes 325 so as to change the phase of the optical signal portion traveling through the section adjacent to that pair. For example, voltage generator 326 may apply voltages proportional to the signal generated by signal generator 102 and received by signal receiver 327. Signal receiver 327 may be operatively coupled to voltage generator 326 and may be any structure capable of receiving a signal such as an analog RF signal, e.g., an antenna.

In optical modulator 120 illustrated in FIG. 3, the two portions of the optical signal in sections 323, 324 may recombine at junction 328 where they interfere with one another. Because the relative phase of the optical signal portions traveling through sections 323, 324 may be controlled via voltage generator 326, the intensity of the recombined optical signal at junction 328 may be modulated based on the signal received by signal receiver 327. For example, if the portion of the optical signal in section 323 is phase-delayed by an even multiple of π relative to that in section 324, then when recombined at junction 328 the two portions of the optical signal will constructively interfere with each other, yielding maximum brightness. Or, for example, if the portion of the optical signal in section 323 is phase-delayed by an odd multiple of π relative to that in section 324, then when recombined at junction 328 the two portions will completely interfere with each other, yielding minimal brightness. The output of optical modulator 120 includes the received signal imposed as an intensity modulation on the chirped, repetitively pulsed optical signal, which may be referred to herein as the modulated, chirped, repetitively pulsed optical signal, or more briefly the modulated optical signal. This output is coupled into a single output optical fiber or waveguide 329. Configurations such as that illustrated in FIG. 3 may be referred to as a Mach-Zehnder modulator (MZM), and may be implemented in a suitable substrate such as lithium niobate, in which waveguides may be provided that define input 321, junction 322, sections 323 and 324, junction 328, and output 329. Other modulators, such as absorptive modulators based on the Franz-Keldysh effect or the quantum confined Stark effect, or other interferometric modulators, may also suitably be used.

Figure 4:
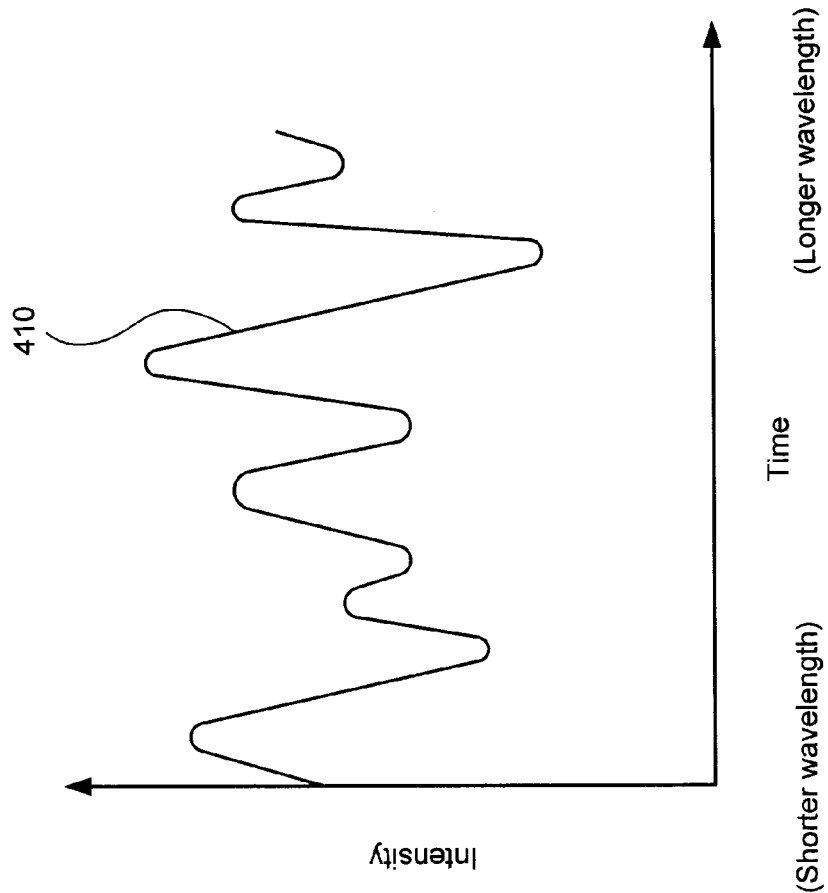
FIG. 4 is a plot illustrating a temporal intensity profile of an exemplary modulated chirped repetitively pulsed optical signal from an optical modulator.

FIG. 4 is a plot illustrating temporal intensity profile 410 of an exemplary modulated optical signal from optical modulator 120. Temporal intensity profile 410 has varying intensities corresponding to imposition of an analog signal onto the chirped, repetitively pulsed optical signal. In this example, the optical pulse is positively chirped, that is, the long-wavelength component lags behind the short-wavelength component in time.

Figure 5:
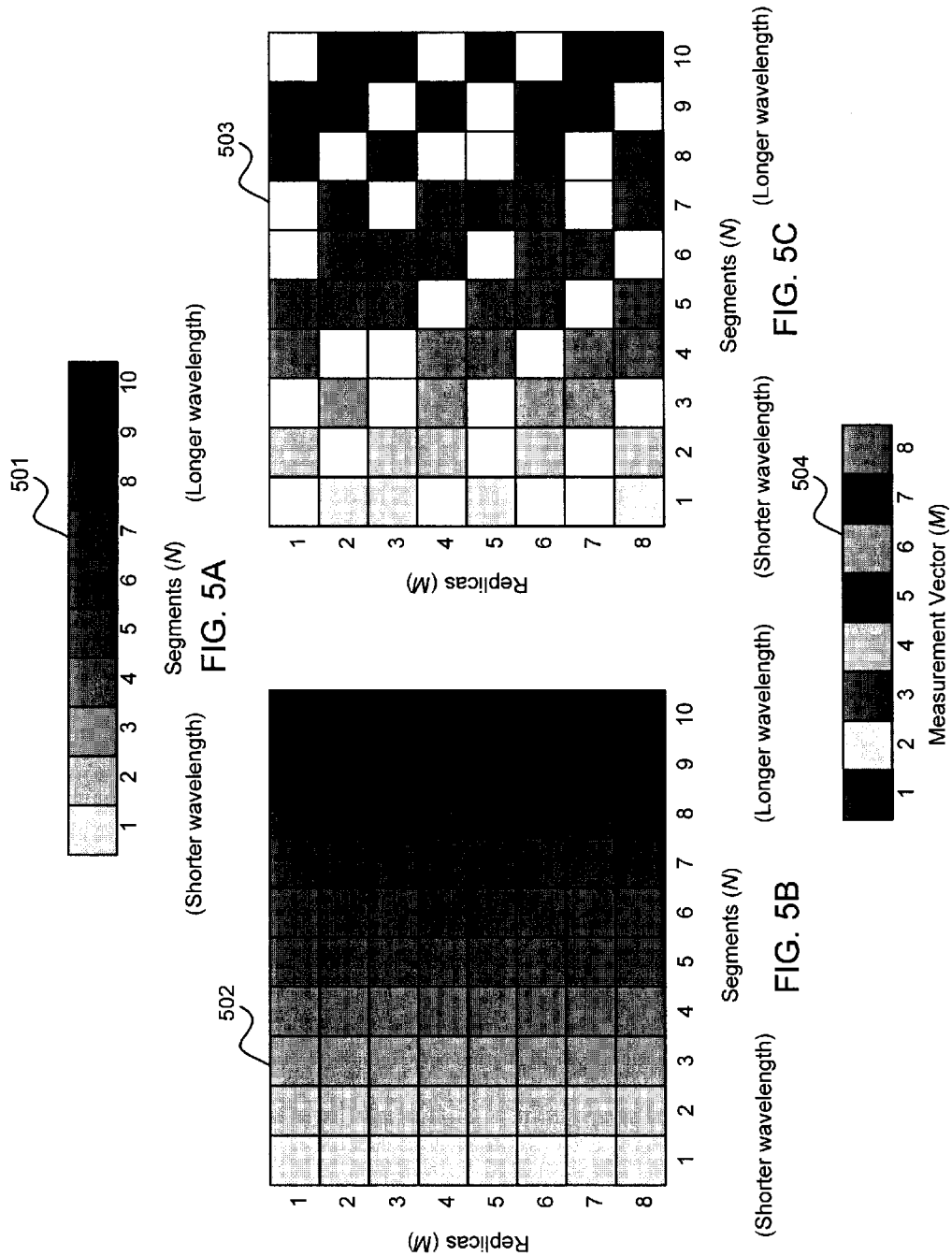
FIG. 5A schematically illustrates segments of a modulated, chirped, repetitively pulsed optical signal.
FIG. 5B schematically illustrates replication of the segments of FIG. 5A.
FIG. 5C schematically illustrates multiplication of the segment replicas of FIG. 5B by an exemplary mixing matrix.
FIG. 5D schematically illustrates an exemplary measurement vector that may be formed by obtaining and integrating different combinations of the segment replicas of FIG. 5C.

Referring back to FIG. 1A, segmenter 130 is configured to segment a signal applied thereto into N segments based on time or wavelength. Specifically, in system 100, segmenter 130 is configured to receive the modulated optical signal from optical modulator 120, and to segment that signal into N segments based on time or wavelength. That is, segmenter 130 may channelize the modulated optical signal into different bins that correspond to different wavelength components of that signal. FIG. 5A schematically illustrates an exemplary arrangement of segments of a modulated optical signal that has been segmented by segmenter 130. In this embodiment, N=10 segments are arranged relative to one another such that shorter wavelength segments, as represented by light gray, are disposed on one end of segmented optical signal 501, and the longer wavelength segments, as represented by dark gray, are disposed on the other end of the segmented optical signal 501. However, it should be understood that the segments may be have any suitable spatial relationship relative to one another. Indeed, segmenter 130 may output each of the segments of segmented optical signal 501 onto its own separate guided wave optical pathway (e.g., optical fiber or waveguide) for further processing, and such pathways need not have any specific spatial relationship with one another. Preferably, segmenter 130 is based on electronics, on guided-wave optics, or some combination thereof. For example, segmenter 130 may include a dispersive guided-wave optical element configured to output different wavelengths input thereto onto N different channels, such as a wavelength division demultiplexing (WDM) device, as described in greater detail below with reference to FIGS. 6 and 8. Or, for example, segmenter 130 may include a cascade of FBGs each tuned to a different group of wavelengths, as described in greater detail below with reference to FIG. 9. Segmenter 130 optionally may include N photodetectors each configured to receive one of the N segments and to output an electronic representation of that segment for further processing, so as to convert the segments from the optical domain into the electronic domain.

As illustrated in FIG. 1A, replicator 140 is configured to obtain M replicas of a signal applied thereto. Specifically, in the particular arrangement of system 100, replicator 140 is configured to receive N segments of the modulated optical signal from segmenter 130, and to generate M replicas of each of those segments, for a total of M×N segment replicas of the modulated optical signal. FIG. 5B schematically illustrates an exemplary arrangement of segment replicas 502 that have been segmented by segmenter 130 and replicated by replicator 140. In this embodiment, N=10 segments are arranged by wavelength in a first dimension as in FIG. 5A, while M=8 replicas of each of those segments are stacked in a second dimension, resulting 80 segment replicas (M×N=80). However, it should be understood that any suitable number of segment replicas may be generated, and that the segment replicas may have any suitable spatial relationship to one another. Indeed, replicator 140 may output each of the segment replicas 502 onto its own separate guided wave optical pathway (e.g., optical fiber or waveguide) for further processing. Moreover, replicator 140 may include N discrete devices, each configured to receive one of the N segments and to output M replicas of that segment, such as described in greater detail below with reference to FIGS. 6 and 8. Preferably, replicator 140 is based on a guided-wave optical element or an electronic element, or some combination of the two. For example, as described in greater detail below with reference to FIG. 6, replicator 140 may include M guided-wave optical splitters, e.g., fiber optic splitters, each configured to receive one of the N segments. Or, for example, as described in greater detail below with reference to FIG. 8, replicator 140 may include M electronic splitters, e.g., voltage dividers, each configured to receive one of the N segments. Alternatively, replicator 140 may generate M replicas of the modulated optical signal and provide those replicas to segmenter 130, as described below with reference to FIG. 1C. The segment replicas may be in the optical domain or in the electronic domain as appropriate.

Referring back to FIG. 1A, mixer 150 may be configured to receive the M×N segment replicas from replicator 140, to multiply the segment replicas by a mixing matrix having dimension M×N, and then to form M integrations each of N segment replicas so as to obtain a measurement vector of length M. FIG. 5C schematically illustrates multiplication of the M×N segment replicas of FIG. 5B by an exemplary mixing matrix 503, represented by white squares superimposed on a subset of the M×N segment replicas. Preferably, in accordance with mixing matrix 503, mixer 150 modifies a first subset of the M×N segment replicas (as represented by the white squares imposed over some of the segment replicas) but does not modify a second subset of the segment replicas (as represented by an absence of white squares imposed over others of the segment replicas). Preferably, mixing matrix 503 is selected so as to pseudo-randomly modify a subset of the segment replicas, but preferably does not modify all of the M replicas of a given segment. In many embodiments, no row of the mixing matrix is identical to any other row of the mixing matrix. The white squares of mixing matrix may represent multiplying the corresponding segment replica by a value of 0 (substantially blocking the segment replica), of −1 (substantially reflecting or reversing the polarity the segment replica), of a value between 0 and 1 (exclusive) (partially blocking the segment replica), or of a value between −1 and 0 (exclusive) (partially reflecting or partially reversing the polarity of the segment replica). Suitable selection of mixing matrix elements is known in the art of compressive sensing.

In addition to modifying the segment replicas in accordance with the mixing matrix, mixer 150 further is configured to obtain and to integrate M different combinations of the modified segment replicas, each combination preferably including N of the segment replicas. Each such integrated combination represents an element of a measurement vector having length M, and based on which a digitized representation of the received signal may be obtained using compressive sensing techniques known in the art. FIG. 5D schematically illustrates an exemplary measurement vector 504 of length M that mixer 150 may obtain by obtaining different combinations of the segment replicas illustrated in FIG. 5C (following multiplication by mixing matrix 503). Preferably, each combination includes N segment replicas, each such segment replica corresponding to a different segment of the modulated optical signal.

Depending on whether the segment replicas are in the optical domain or in the electronic domain, mixer 150 may be configured suitably to modify a subset of the segment replicas and to obtain and integrate combinations of such segment replicas. For example, if the segment replicas are in the optical domain, mixer 150 may include one or more guided-wave optical components configured to prevent or reduce transmission of the subset of segment replicas by optically attenuating or blocking each of those segment replicas, e.g., as described in greater detail below with reference to FIG. 6, or by substantially reflecting those segment replicas, e.g., as described in greater detail below with reference to FIG. 9. Indeed, mixer 150 may include a single guided-wave based optical component configured to receive and to process all of the M×N segment replicas, or may include a suitable number of such guided-wave based components, e.g., may include M×N of such guided-wave based optical components, one for each segment replica. Or, for example, if the segment replicas are in the electronic domain, mixer 150 may be configured to electronically attenuate or block those segment replicas, or alternatively to reverse the polarity of those segment replicas e.g., as described in greater detail below with reference to FIG. 8. Such an electronic based mixer may include a single electronic based component configured to receive and to process all of the M×N segment replicas, or may include any suitable number of such electronic based components, e.g., may include M×N electronic based components, one for each segment replica. Following processing by mixer 150, the measurement vector may be in the electronic domain or in the optical domain.

Referring back to FIG. 1A, signal recovery processor 160 is configured to obtain a digital representation of the received signal based on the measurement vector and on the mixing matrix. Specifically, in some embodiments, mixer 150 outputs to signal recovery processor 160 M optical signals representing the M elements of the measurement vector, and the signal recovery processor may include M photodiodes each configured to receive a corresponding one of the M optical signals and to generate an electronic representation of that signal, that is, an electronic representation of the corresponding element of the measurement vector. In other embodiments, mixer 150 outputs to signal recovery processor 160 one or more electronic signals representing the M elements of the measurement vector. In either case, signal recovery processor 160 may include one or more electronic based devices configured to convert analog signals into digital signals, e.g., an analog-to-digital converter (ADC), for further processing. In still other embodiments, segmenter 130, replicator 140, or mixer 150 includes one or more ADCs, and mixer 150 outputs to signal recovery processor 160 a digital electronic signal representing the M elements of the measurement vector. Additionally, signal recovery processor 160 may include any suitable device capable of signal recovery, e.g., a processor, and may include a memory device such as random access memory (RAM), a flash drive, or other recordable medium for storing the analog or digital signal representing the M elements of the measurement vector, as well as the digital representation of the received signal.

Signal recovery processor 160 is configured to obtain a digital representation of the originally received signal based on the measurement vector and on the mixing matrix. For example, if the mixing matrix is square (if M=N), then signal recovery processor 160 may obtain the digital representation of the originally received signal by performing an operation that may be considered to be equivalent to multiplying the measurement matrix by the inverse of the mixing matrix. For example, a singular dot product of dimension M×1 (e.g., the mixing matrix) may be multiplied by the inverse of a mixing matrix of dimension $[M \times m]^{-1}$, resulting in a digital representation of the received signal, having dimension M×1. Alternatively, if the mixing matrix is non-square (if M≠N), then signal recovery processor 160 instead may obtain the digital representation of the received signal through techniques known in the art of compressive sensing, e.g., using suitable computer software, which may be stored in a volatile or non-volatile memory device within signal recovery processor 160, e.g., RAM, ROM, or flash memory.

As will be familiar to those of ordinary skill in the art, compressive sensing is a methodology for preprocessing sparse data in the analog domain, e.g., an analog signal, prior to digitization in such a way that fewer digital resources, e.g., fewer ADCs, are required to obtain an accurate representation of the sparse data. See, for example, Candès et al., "An Introduction To Compressive Sampling," IEEE Signal Processing Magazine 25(2): 21-30 (March 2008), the entire contents of which are incorporated by reference herein. In some embodiments, the compressive sensing techniques employed in the systems and methods described herein may use a relatively new set of algorithms developed for sampling signals and images at rates much lower than the traditional Nyquist rate. See, for example, Loris, "L1 Packv2: A Mathematica package for minimizing an $l_1$-penalized functional," pg. 1-17 (Aug. 20, 2008), the entire contents of which are incorporated by reference herein. Loris discloses the use in compressive sensing of a Mathematica® (Wolfram Research, Champaign, Ill.) package called L1Packv2 that includes an algorithm called FindMinimizer that may be used to obtain a digital representation of the received signal. Signal recovery processor 160 may use the L1Packv2 package, or any other suitable set of algorithms, to obtain a digital representation of the originally received signal based on the mixing matrix and the measurement vector.

Signal recovery processor 160 further may be configured to determine the modulation format of the digital representation of the received signal, e.g., using suitable computer software stored within a memory device of signal recovery processor 160. Non-limiting examples of analog modulation formats include amplitude modulation, double-sideband modulation, single-sideband modulation, vestigial sideband modulation, quadrature amplitude modulation, angle modulation, frequency modulation, pulse position modulation, and phase modulation. Signal recovery processor 160 may be configured to demodulate the digital representation based on the determined modulation format, e.g., using suitable computer software stored within a memory device of signal recovery processor 160. Indeed, signal recovery processor 160 may be configured both to determine the modulation format and to demodulate the digital representation of the received signal based on the determined modulation format. Signal recovery processor 160 further may be coupled to a display unit (not illustrated) such as an LED or LCD-based display screen configured to display the digital representation of the received signal to a user.

Note that although FIG. 1A illustrates a particular arrangement of segmenter 130, replicator 140, and mixer 150 relative to one another, that other arrangements of these elements suitably may be used. For example, in alternative system 100' illustrated in FIG. 1B, alternative replicator 140' is configured to receive the modulated optical signal from optical modulator 120, and is configured to obtain M replicas of that signal. Alternative segmenter 130' is configured to receive the M replicas of the modulated optical signal from replicator 140', and to segment each of those replicas into N segments, for a total of M×N segment replicas. Mixer 150 then may receive and process the segment replicas as described in greater detail herein. Or, for example, in alternative system 100" illustrated in FIG. 1C, the functionalities of the segmenter and the mixer may be provided in combined segmenter-mixer device 145 that receives M replicas of the modulated optical signal from replicator 140' and segments and mixes those replicas so as to obtain a measurement vector. Or, for example, in alternative system 100''' illustrated in FIG. 1D, the functionalities of the replicator and the mixer may be provided in combined replicator-mixer device 145' that receives N segments of the modulated optical signal from segmenter 130 and replicates and mixes those segments so as to obtain a measurement vector. Other arrangements of elements suitably may be provided.

Some exemplary embodiments of systems for obtaining a digital representation of a received signal now will be described with reference to FIGS. 6-9.

Figure 6:
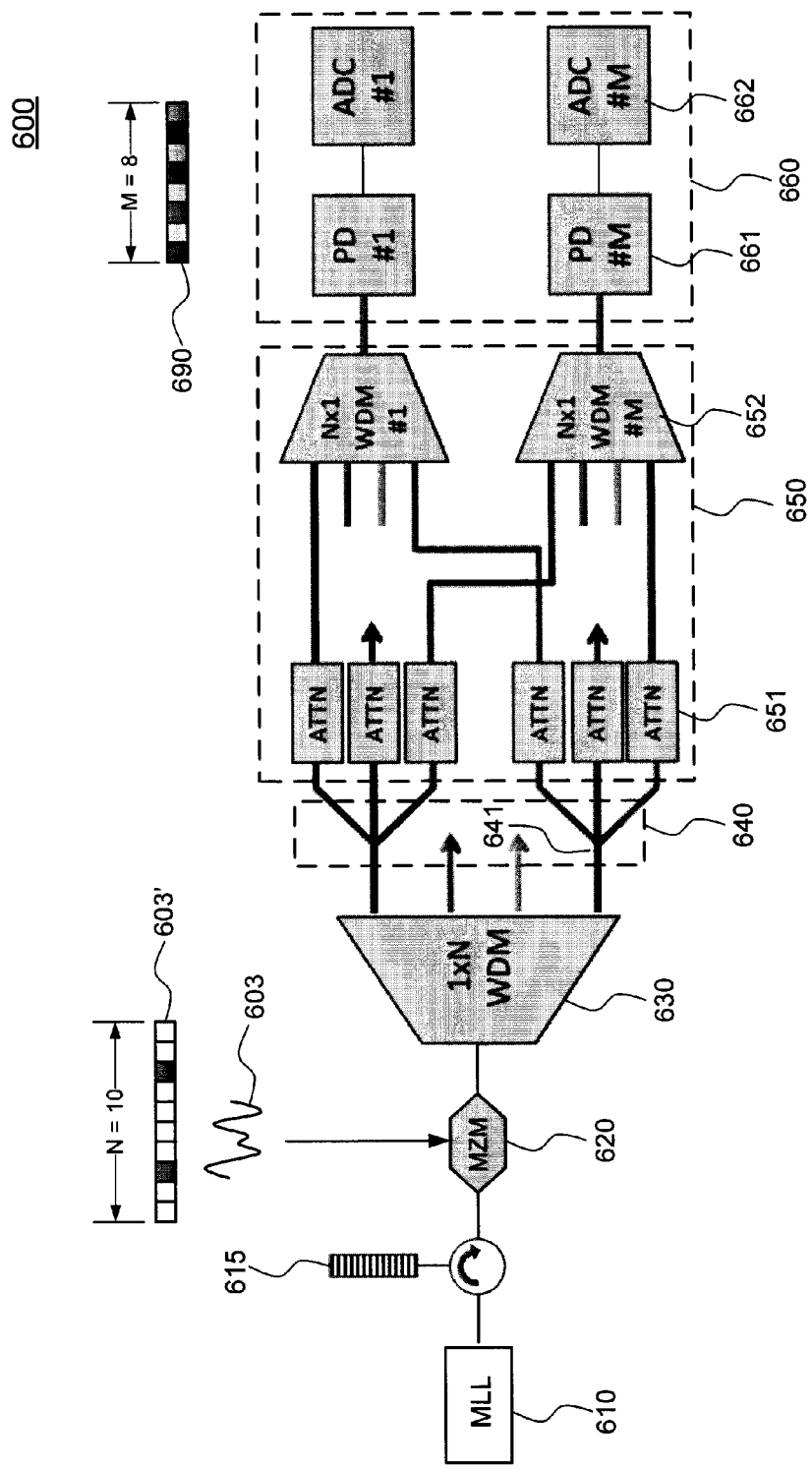
FIG. 6 illustrates an exemplary system for obtaining a digital representation of a wideband analog signal based on guided-wave optical components, according to some embodiments of the present invention.

Specifically, FIG. 6 illustrates an exemplary apparatus 600 for obtaining a digital representation of an analog signal, e.g., an analog RF signal, and that suitably may be used to obtain a digital representation of a digital signal. Apparatus 600 includes mode-locked laser (MLL) 610, chirped fiber Bragg grating (FBG) 615, Mach-Zehnder modulator (MZM) 620 which receives analog signal 603 from a signal source (not illustrated), guided-wave optic based segmenter 630, guided-wave optic based replicator 640, guided-wave optic based mixer 650, and signal recovery processor 660 (partially shown in FIG. 6).

Mode-locked laser (MLL) 610 illustrated in FIG. 6 generates a repetitive sequence of optical pulses, which in some embodiments are ultrafast pulses, and provides the optical pulses to chirped FBG 615 via a guided-wave optical element, such as a waveguide or an optical fiber. Chirped FBG 615 chirps each optical pulse in the sequence so as to generate a chirped, repetitively pulsed optical signal. As discussed above with respect to FIGS. 2A-2D, each optical pulse in the sequence may be linearly or nonlinearly chirped, and may be positively or negatively chirped. Preferably, the chirped, repetitively pulsed optical signal has a substantially uniform intensity as a function of time, although small non-uniformities can be calibrated out of the system in the Signal Recovery Processor 160. Chirped FBG 615 further may be calibrated to eliminate any detected timing errors in the optical signal.

The chirped, repetitively pulsed optical signal travels via a guided-wave optical element, such as a waveguide or an optical fiber, from chirped FBG 615 to MZM 620. MZM 620 then imposes analog signal 603 on that optical signal by modulating the intensity of the optical signal in accordance with temporal and frequency characteristics of analog signal 603. Analog signal 603 may be generated by a remote apparatus (not illustrated) and received by MZM 620 using any suitable means. Analog signal 603' is a representation of analog signal 603 in vector form having dimension N×1. In this example, N equals ten. Analog signal 603' is sparse, as represented by eight white squares and two gray squares, because the signal contains a small number of significant frequencies (gray squares) relative to the band limit (N).

The modulated optical signal travels from MZM 620 through a guided-wave optical element, such as a waveguide or an optical fiber, to guided-wave optic based segmenter 630. In the embodiment illustrated in FIG. 6, guided-wave optic based segmenter 630 includes a wavelength division demultiplexer (WDM) having dimension 1×N, which is configured to segment the modulated optical signal into N segments based on wavelength. WDMs are commercially available and may be selected so as to segment a signal of suitable wavelengths applied thereto into at least N segments based on time or wavelength, e.g., may be selected so as to output different wavelength components generated by MLL 610 into N different channels. For example, if MLL 610 and chirped FBG 615 generate wavelengths in the "C-band" (e.g., 1530-1565 nm), then WDM 630 preferably also operates in the C-band, and in one embodiment is a "dense" WDM having 80 channels and a channel spacing of 0.4 nm (32 nm total). If MLL 610 and chirped FBG 615 generate wavelengths in both the C- and L-bands (e.g., 1565-1625 nm), then two dense WDM devices such as those described above may be provided to segment the modulated optical signal into 160 channels. Alternatively, "ultra-dense" WDMs may be used that provide channel spacings of 0.1 nm, thus enabling generation of additional segments, such as the ultra DWDM Mux/Demux available from Kylia Products (Paris, France). Guided-wave optic based elements other than WDMs suitably may be used to segment the modulated optical signal.

The N segments then travel from segmenter 630 to guided-wave optic based replicator 640 through N corresponding guided-wave optical elements, such as waveguides or optical fibers. In the embodiment illustrated in FIG. 6, replicator 640 includes N optical splitters 641, each of which is configured to receive a corresponding one of the segments and to output M replicas of that segment. Thus, segmenter 630 and replicator 640 together are configured to obtain M×N segment replicas of the modulated optical signal. Optical splitters are commercially available and may be selected so as to divide an optical signal input thereto into M replicas of that signal. Guided-wave optic based elements other than optical splitters suitably may be used to replicate the segments input thereto. Additionally, note that the relative arrangement of segmenter 630 and replicator 640 illustrated in FIG. 6 is analogous to that shown in FIG. 1A. However, it should be recognized that the relative positions of segmenter 630 and replicator 640 suitably may be modified in a manner analogous to that shown in FIG. 1B. For example, a replicator including an optical splitter may be used to generate M replicas of the modulated optical signal, and a segmenter including M WDMs of dimension 1×N may be used to respectively segment each of the M replicas, for a total of M×N segment replicas. Other suitable arrangements of other guided-wave optic or electronic based replicators and segmenters may be envisioned.

As illustrated in FIG. 6, the M×N segment replicas travel from replicator 640 to guided-wave optic based mixer 650 through M×N corresponding guided-wave optical elements, such as waveguides or optical fibers. Mixer 650 may include M×N optical attenuators 651 and M wavelength division multiplexers (WDMs) 652 having dimension N×1. In mixer 650, the M×N optical attenuators 651 may be configured to multiply the M×N segment replicas by corresponding elements of a mixing matrix having dimension M×N, in a manner analogous to that described above with reference to FIG. 5C. That is, each optical attenuator 651 may be configured to receive one of the segment replicas from a corresponding splitter 641, and to multiply that segment replica by an element of the mixing matrix by either substantially blocking that segment replica (corresponding to the white squares in FIG. 5C) or by substantially transmitting that segment replica (corresponding to the grey squares in FIG. 5C). The attenuators 651 may transmit a segment replica by substantially passing that segment replica, or may block a segment replica by substantially absorbing that segment replica, or by reflecting that replica without making further use of that reflection. Note that substantially complete absorption of a segment replica corresponds to multiplying that segment replica by a mixing matrix element of "0", while substantially complete transmission of a segment replica corresponds to multiplying that segment replica by a mixing matrix element of "1." In some embodiments, segment replicas may be multiplied by matrix elements between 0 and 1 (exclusive) by only partially absorbing the segment replica. Preferably, the attenuators are fixed optical elements, so as to permanently apply the same mixing matrix to any segment replicas passing therethrough. Alternatively, the attenuators 651 may be dynamically adjustable optical elements, the transmission characteristics of which suitably may be adjusted by applying a suitable current or voltage thereto with a controller (not illustrated). Indeed, it may be useful to configure mixer 650 so as to dynamically adjust the elements of the mixing matrix, e.g., so that undesired or interfering signals within the received signal suitably may be blocked by imposing matrix elements of "0" to segment replicas that contain such undesired or interfering signals.

In mixer 650, M WDMs 652 may be configured to receive and to integrate different combinations of the M×N segment replicas from attenuators 651 via M×N guided-wave optical elements, such as waveguides or optical fibers. Preferably, each combination includes N of the segment replicas, and each segment replica is based on a different segment than each other segment replica. For example, in the embodiment illustrated in FIG. 6, each of the WDMs 652 is configured to receive one segment replica that is based on the first segment generated by WDM 630, one segment replica that is based on the second segment generated by WDM 630, and so on. Each of the M WDMs 652 optically integrates the received combination of N segment replicas into a single optical output corresponding to one of the M elements of the measurement vector described above with reference to FIG. 5D.

Figure 7:
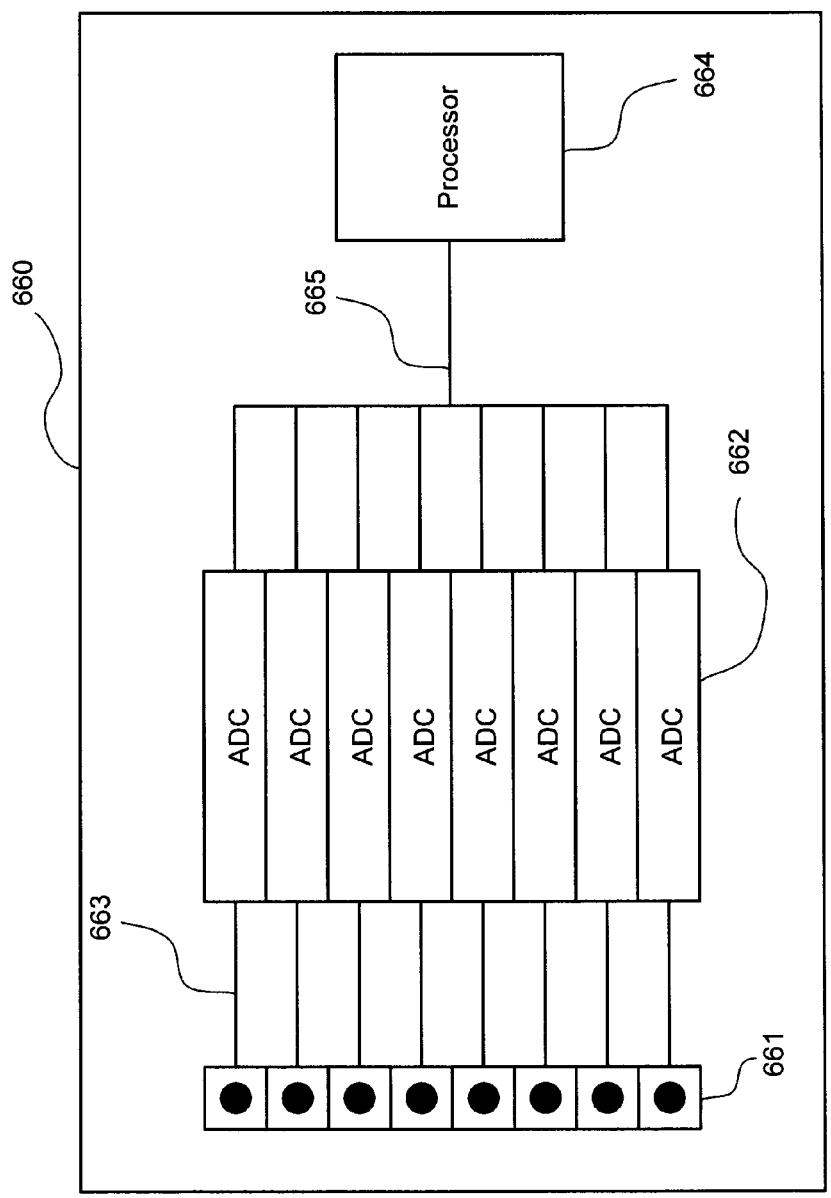
FIG. 7 illustrates components of an exemplary mixer and exemplary signal recovery processor that may be used in the system of FIG. 6.

Signal recovery processor 660 illustrated in FIG. 6 includes an array of M photodetectors (PDs) 661, and an array of M analog-to-digital converters (ADCs) 662, shown in greater detail in FIG. 7 (in which M=8). Each photodetector 661 receives a corresponding one of the M elements of the measurement vector from one of WDMs 652 via a guided-wave optical element, such as a waveguide or optical fiber. Photodetectors 661 may be any device configured to convert light into current or voltage, such as a photodiode, and by design may include a low-pass filter. In some embodiments, photodetectors 661 includes a linear photodiode array matched to mixer 650 such that a separate waveguide or optical fiber for coupling is not necessary. Each photodetector 661 obtains an electronic representation of the corresponding element of the measurement vector, and provides that electronic representation to a corresponding one of ADCs 662 via a suitable electronic pathway 663, e.g., a conductor. ADC 662 then generates a digital representation of the corresponding element of the measurement vector, and provides that digital representation to processor 664 via a suitable electronic pathway 665, e.g., a conductor. Preferably, ADCs 662 are synchronized to MLL 610. It should be noted that photodetectors 661 and ADCs 662 equivalently may be provided as part of mixer 650, and mixer 650 may provide digital representations of the M elements of the measurement vector to processor 664 of signal recovery processor 660.

Processor 664 is configured to recover a digital representation of the received signal 603 based on the M elements of the measurement vector and the mixing matrix, using compressive sensing techniques known in the art. Processor 664 may be any suitable processing unit configured to perform signal recovery, determining a modulation format, or demodulating a digital signal based on a demodulation format, e.g., a dedicated circuit, a computer, and may be configured to run a program for signal recovery, determining a modulation format, and/or demodulating a digital signal based on a demodulation format in suitable software, e.g., Matlab® (The MathWorks, Inc., Natick, Mass.) or Mathematica® (Wolfram Research, Champaign, Ill.). Processor 664 may be configured obtain the digital representation of the received signal using known techniques of signal recovery, compressive sensing, and digital demodulation.

The signal processing implemented by system 600 illustrated in FIG. 6 may digitize received signal 603 at a sampling rate at least M times greater than the sampling rate of any given ADC 662 in signal recovery processor 660, where M is the number of segments into which received signal 603 is segmented. For example, a system using signal recovery processor 660 illustrated in FIG. 7 would be configured to sample a received signal at a rate at least eight times greater than the sampling rate of each ADC 662. As a result, wideband signals may be converted into digital signals using ADCs that may be commercially available at relatively low cost and may have a relatively low data rate (e.g., less than 500 megasamples/second), and relatively low power (e.g., less than 0.1 picojoules per conversion step). In this regard, it should be noted that the bandwidth of system 600 suitably may be increased to accommodate broadband signals of a desired wavelength by increasing M accordingly, that is, by suitably selecting the number of replicas obtained by replicator 640 and by suitably selecting the configurations of segmenter 630 and mixer 650 accordingly. The value of N may be selected so as to sufficiently channelize received signal 603 to obtain representations of different signal components therein, as is known in the art of compressive sensing.

Additionally, note that the net effect of segmenter 630, replicator 640, and mixer 650 is to multiply analog signal 603 (represented in vector form 603' as an N×1 vector) by the mixing matrix (an M×N matrix) to obtain a measurement vector 690 (an M×1 vector). Measurement vector 690 is a compressed version of the M×N segment replicas. For example, each element of measurement vector 690 includes components of each frequency of analog signal 603' in compressed form. Unlike analog signal 603, which is sparse, each element of measurement vector 690 includes significant frequencies (represented by gray squares of varying shades).

Figure 8:
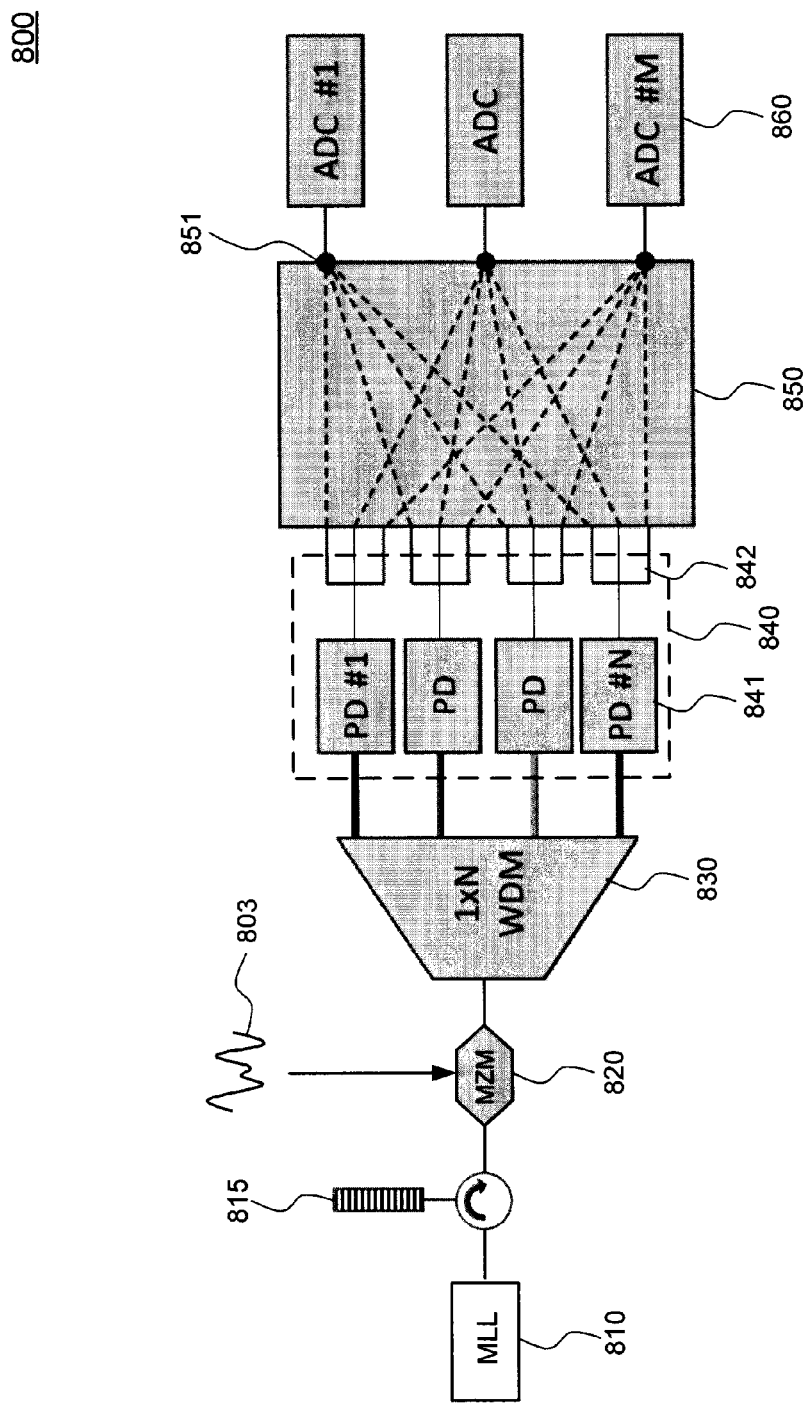
FIG. 8 illustrates an alternative system for obtaining a digital representation of a wideband analog signal based on electronics and guided-wave optical components, according to some embodiments of the present invention.

FIG. 8 illustrates an exemplary system 800 for obtaining a digital representation of a signal that is based on both guided-wave optic and electronic components. Specifically, system 800 includes MLL 810, chirped FBG 815, MZM 820, guided wave optic based segmenter 830, electronic based replicator 840, electronic based mixer 850, and signal recovery processor 860 (shown in part). MLL 810, chirped FBG 815, and MZM 820 may be configured analogously to the corresponding components in system 600 described above with reference to FIG. 6. Segmenter 830 of system 800 includes wavelength-division demultiplexer (WDM) 831 of dimension 1×N, which may be configured analogously to WDM 630 described above and that may be configured to segment received signal 803 into N segments. Electronic based replicator 840 includes N photodetectors (PDs) 841 and N electronic splitters 842. Each of the N photodetectors is coupled to a corresponding output of WDM 831 via a corresponding guided-wave optical component, such as a waveguide or an optical fiber. Each of the N photodetectors 841 is configured to output an electronic representation of the segment that it receives to a corresponding electronic based splitter 842, which may include, for example, a voltage divider or a current divider. Each of the N electronic based splitters 842 is configured to output M replicas of the electronic representation of the segment that it receives, for a total of M×N segment replicas in the electronic domain. Optionally, the outputs of photodetectors 841 are amplified before being provided to splitters 842, so that the segment replicas have sufficient current or voltage for further processing.

Note that photodetectors 841 equivalently may be provided as part of segmenter 830. Additionally, note that the relative arrangement of photodetectors 841 and electronic based splitters 842 in replicator 840 suitably may be modified. For example, the N electronic based splitters 842 may be replaced by N guided-wave optic splitters, each configured to receive one of the N segments in the optical domain from WDM 830, and to output M replicas of the received segment in the optical domain. M×N photodiodes may be configured to receive the resulting M×N segment replicas in the optical domain and to convert those segment replicas into the electronic domain for further processing by mixer 850.

Mixer 850 includes an electronic based switch configured to multiply each of the M×N segments by a corresponding element of the mixing matrix by either substantially transmitting or substantially blocking that segment replica. The electronic based switch of mixer 850 further includes M output ports 851, each of which is configured to receive and to integrate N of the segment replicas following such multiplication to form a corresponding one of the M elements of the measurement vector, for example by summing the voltages or currents of the segment replicas routed thereto. Output ports 851 are coupled via suitable conductive pathways to M corresponding ADCs of signal recovery processor 860, which may be configured analogously to signal processor 660 above except that photodetectors 661 are not needed in FIG. 8 to convert the M elements of the measurement vector into the electronic domain for further processing with a suitably programmed processor analogous to processor 664 illustrated in FIG. 7 (not shown in FIG. 8).

Electronic switches suitable for use in mixer 850 are commercially available, and may be referred to as an (NM)×N non-blocking switch. Such switches may be implemented with a suitably programmed processor, application specific integrated circuit (ASIC), or field-programmable gate array (FPGA). Examples of switching devices suitable for use in mixer 850 include the AD75019JP 16×16 crosspoint switch array available from Analog Devices, Inc. (Norwood, Mass.), the MT093AP ISO-CMOS 8×12 analog switch array available from Mitel Networks Corporation (Ottawa, Ontario, Canada), and the 16-element phased-array transmitter described in Koh et al., "A millimeter-wave (40-45 GHz) 16-element phased array transmitter in 0.18 μm SiGe BiCMOS technology," IEEE Journal of Solid-State Circuits, 44(5): 1498-1509 (2009), the entire contents of which are incorporated herein by reference.

Substantially blocking a segment replica within mixer 850 corresponds to multiplying that segment replica by a mixing matrix element of "0", while substantially transmitting a segment replica corresponds to multiplying that segment replica by a mixing matrix element of "1." In some embodiments, segment replicas may be multiplied by matrix elements between 0 and 1 (exclusive) by only partially transmitting the segment replica. Alternatively, segment replicas may be multiplied by negative matrix elements, e.g., "−1" by reversing the polarity of the segment replica. The various pathways through the switch (illustrated in FIG. 8 as dashed lines) may be fixed, so as to permanently apply the same mixing matrix to any segment replicas passing therethrough. Alternatively, the pathways may be dynamically adjustable electronic elements, the transmission characteristics of which suitably may be adjusted by applying a suitable current or voltage thereto. It may be useful to configure mixer 850 so as to dynamically adjust the elements of the mixing matrix, e.g., so that undesired or interfering signals within the received signal suitably may be blocked by imposing matrix elements of "0" to segment replicas that contain such undesired or interfering signals.

Additionally, note that the arrangement of mixer 850 and the ADCs of signal recovery processor 860 suitably may be modified. For example, N ADCs may be configured respectively to receive and to digitize electronic signals output by N photodetectors 841, and to provide the digitized signals to splitters 842 before further processing by mixer 850. Or, continuing with the above-mentioned alternative configuration of photodetectors 841 and splitters 842, M×N ADCs may be configured respectively to receive and to digitize electronic signals output by the M×N photodetectors before further processing by mixer 850. Other suitable arrangements of elements may be envisioned.

Figure 9:
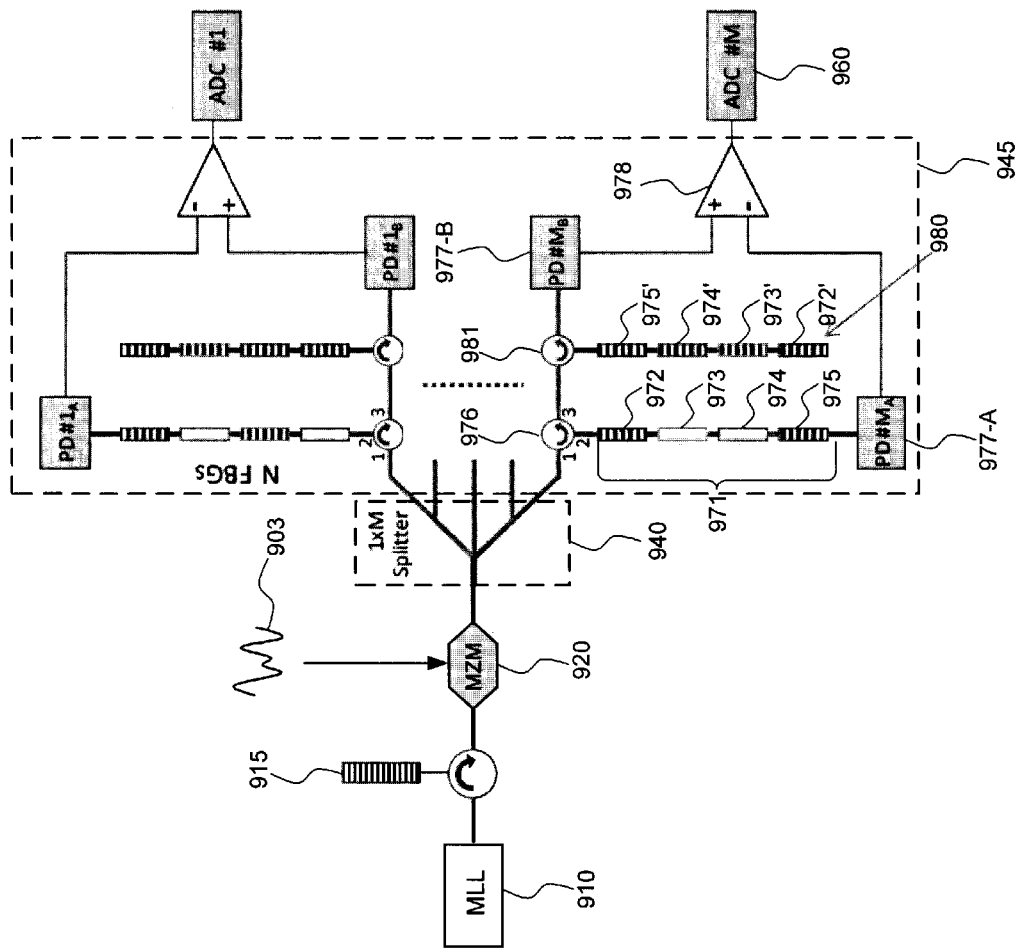
FIG. 9 illustrates another alternative system for obtaining a digital representation of a wideband analog signal based on electronics and guided-wave optical components, according to some embodiments of the present invention.

FIG. 9 illustrates another exemplary system 900 for obtaining a digital representation of a signal that is based on both guided-wave optic and electronic components. Specifically, system 900 includes MLL 910, chirped FBG 915, MZM 920, guided-wave optic based replicator 940, segmenter-mixer 945 based on both guided-wave optics and electronics, and signal recovery processor 960 (shown in part in FIG. 9). MLL 910, chirped FBG 915, and MZM 920 may be configured analogously to the corresponding components in system 600 described above with reference to FIG. 6. Replicator 940 may include a guided-wave optic based splitter of dimension 1×M, which is configured to receive the modulated optical signal from MZM 920 and to generate M replicas of the modulated optical signal.

Segmenter-mixer 945 is configured to provide the functionalities both of a segmenter and a mixer. Specifically, segmenter-mixer 945 includes M×N FBGs that are arranged in M units 971 each having N FBGs 972-975 therein (here, N=4), and each being configured to receive a corresponding one of the M replicas of the modulated optical signal from replicator 940 via a corresponding circulator 976. Each of FBGs 972-975 in a given unit 971 is tuned to a different wavelength of light than each other FBG in that unit. For example, FBG 972 may be tuned to a relatively long group of wavelengths, FBG 973 may be tuned to a shorter group of wavelengths than is FBG 972, FBG 974 may be tuned to a shorter group of wavelengths than is FBG 973, and FBG 975 may be tuned to a shorter group of wavelengths than is FBG 974. As a replica of the modulated optical signal traverses FBGs 972-975, in that order, dispersive interactions between different groups of wavelengths within that signal and the correspondingly tuned FBGs cause those groups of wavelengths to experience temporal delays relative to one another. Each of the resulting wavelength groupings, which are delayed relative to one another, corresponds to a segment replica. Accordingly, inputting each of the M replicas into a corresponding unit of N FBGs generates M×N segment replicas.

In addition to segmenting the replicas of the modulated optical signal, the M×N FBGs of segmenter-mixer 945 also may impose elements of the mixing matrix onto the segmented replicas. Specifically, a first subset of the M×N FBGs may be configured to substantially reflect the wavelengths to which those FBGs are tuned, and a second subset of the M×N FBGs may be configured to substantially transmit the wavelengths to which those FBGs are tuned, so as to multiply the M×N segment replicas by the mixing matrix. Substantially reflecting a group of wavelengths corresponds to multiplying that segment replica by a mixing matrix element of "−1," while substantially transmitting a group of wavelengths corresponds to multiplying that segment by a mixing matrix element of "1." For example, in exemplary unit 971 illustrated in FIG. 9, FBGs 972 and 975 may be configured to substantially reflect the wavelengths to which those FBGs are tuned (e.g., the longest and shortest groups of wavelengths), while FBGs 973 and 974 may be configured to substantially transmit the wavelengths to which those FBGs are tuned (e.g., the second and third shortest groups of wavelengths). In some embodiments, segment replicas (groups of wavelengths) may be multiplied by matrix elements between −1 and 0 (exclusive) or between 0 and 1 (exclusive), by partially reflecting or partially transmitting the groups of wavelengths using corresponding FBGs.

Units 971 suitably may be fabricated within a single optical fiber, using known techniques, and may be provided as a cascade of multiple narrowband FBGs, as illustrated in FIG. 9, or as a single broadband chirped FBG with a tailored reflection profile. Use of multiple FBGs to reflect or transmit wavelength channels may be found in telecommunications for optical code-division multiple access (CDMA) systems, as described in Wei et al., "New code families for fiber-Bragg-grating based spectral amplitude-coding optical CDMA systems," IEEE Photonic Technology Letters 13(8):890-892 (2001), the entire contents of which are incorporated by reference herein.

In the embodiment illustrated in FIG. 9, each of the M units 971 is associated with a corresponding pair of photodetectors (PDs) 977-A, 977-B, for a total of 2M photodetectors. A first photodetector 977-A of the pair is configured to receive light transmitted by FBGs 972-975 of the unit via a guided-wave optical component such as a waveguide or optical fiber, and to convert the received light into a first electronic signal. A second photodetector 977-B of the pair is configured to receive light reflected by FBGs 972-975 of the unit via circulator 976 and a guided-wave optical component such as a waveguide or optical fiber, and to convert the received light into a second electronic signal. Each of the M units 971 also includes a corresponding integration circuit 978, e.g., a difference amplifier, configured to receive the first and second electronic signals from the corresponding pair of photodetectors associated with that unit, and to output a corresponding one of the M elements of the measurement vector in the electronic domain based on the first and electronic signals.

In particular, integration circuit 978 may be configured to output the difference between the first electronic signal and the second electronic signal. Because the second electronic signal corresponds to reflections of segment replicas—that is, segment replicas that have been multiplied by mixing matrix elements having negative values, e.g., −1—obtaining the difference between the first and second electronic signals at integration circuit 978 may provide a suitably compressed representation of the M×N segment replicas substantially without loss of information within received signal 903. Each of the M integration circuits 978 may output the corresponding element of the measurement vector to a corresponding ADC of 960 for conversion to a digital representation and further processing with a suitably programmed processor analogously to processor 664 illustrated in FIG. 7 (not shown in FIG. 9).

Optionally, segmenter-mixer 945 may include M additional FBG units 980 that are configured to offset timing delays that may be generated by the M units 971 of N FBGs 972-975. Specifically, as noted above, the relative timings of segment replicas that are either transmitted through or reflected by FBGs 972-975 may be different than one another, based on dispersive properties of the FBGs. The reflected segment replicas from a given unit 971 may be directed to an additional FBG unit 980 via corresponding circulator 981 and a guided-wave optical component such as a waveguide or optical fiber. Additional FBG unit 980 may include N FBGs 972'-975' that respectively are tuned to analogous wavelengths as are FBGs 972-975 of unit 971, but are arranged in the opposite order as FBGs 972-975, and all substantially transmit the wavelengths to which they are tuned. Accordingly, transmission of the reflected segment replicas from unit 971 through additional FBG unit 980 and then back through circulator 981 and to second photodetector 977-B substantially reverses the modifications to timing of those segment replicas that were incurred within unit 971. Such reversal of the reflected segment replicas' timing modification may facilitate integration of the reflected segment replicas with the transmitted segment replicas at integration circuit 978. Preferably, additional FBG unit 980 maintains all of the reflected or transmitted segment replicas associated with a given chirped optical pulse generated by MLL 910 and chirped FBG 915 within the period of that pulse. Alternatively, additional FBG units 980 may be omitted, and the chirp of the modulated optical signal suitably may be modified with chirped FBG 915 so as to offset timing delays generated by the M×N FBGs.

Additionally, it should be noted that other configurations of photodetectors suitably may be used in system 900. For example, segmenter-mixer 945 instead may include only M photodetectors, each associated with a corresponding one of the M units 971. The photodetector may be configured to receive light transmitted by FBGs 972-975 of unit 971 in a manner analogous to that of photodetector 977-A. Note that in such an embodiment, reflection of corresponding groups of wavelengths by FBGs 972 and 975 effectively multiplies those segment replicas by mixing matrix elements of value "0," because the reflected light (and the information therein) is not used. Alternatively, the photodetector may be configured to receive light reflected by FBGs 972-975 of unit 971 in a manner analogous to that of photodetector 977-B, in which additional FBG unit 980 optionally may be provided to offset timing delays generated within unit 971. Note that in such an embodiment, transmission of corresponding groups of wavelengths by FBGs 973 and 974 effectively multiplies those segment replicas by mixing matrix elements of value "0," because the transmitted light (and the information therein) is not used, while reflection of corresponding groups of wavelengths by FBGs 972 and 975 effectively multiplies those segment replicas by mixing matrix elements of value "1." In either of these embodiments, the photodetector integrates the received light to form a corresponding one of the M elements of the measurement vector in the electronic domain, and may provide that element to a corresponding ADC of signal recovery processor 960 analogously as described above.

Figure 10A:
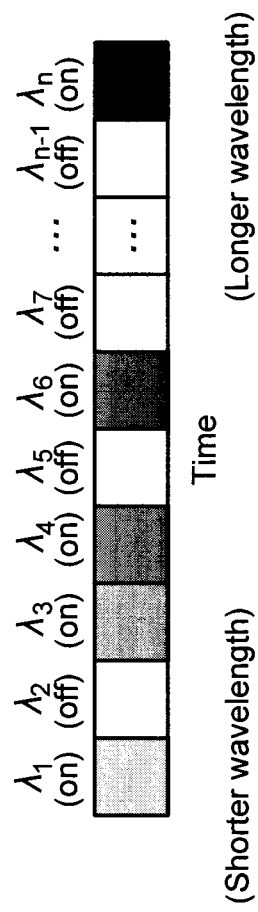
FIGS. 10A-10B respectively illustrate temporal and frequency profiles of an exemplary optical digital signal.
Figure 10B:
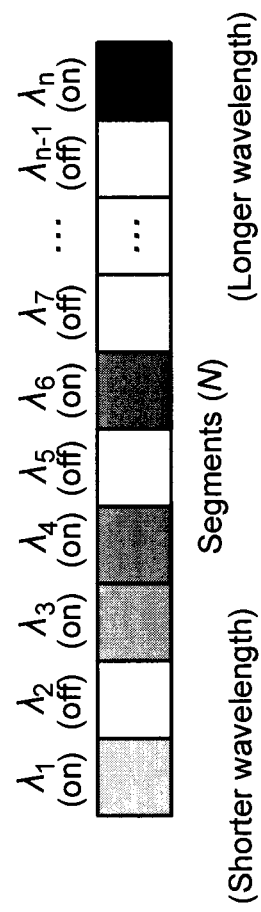

Note that the systems described above with reference to FIGS. 1A-1D and 6-9 suitably may be modified to obtain an electronic digital representation of received signals other than analog or digital RF signals, e.g., an optical digital signal. FIG. 10A is a plot illustrating a temporal profile of an exemplary optical digital signal. The optical digital signal includes n sequential pulses each at a different wavelength and each carrying an independent data stream as a function of time. The shorter wavelengths are represented by light gray and the longer wavelength frequencies are represented by dark gray. In this example, $\lambda_n > \lambda_{n-1} > \ldots > \lambda_7 > \lambda_6 > \lambda_5 > \lambda_4 > \lambda_3 > \lambda_2 > \lambda_1$ and the modulation format of the signal is on/off keying as represented by pulses $\lambda_1, \lambda_3, \lambda_4, \lambda_6$, and $\lambda_n$ being on and $\lambda_2, \lambda_5, \lambda_7$, and $\lambda_{n-1}$ being off. Although not shown in this example, the wavelengths of the sequential pulses may vary in time based on the optical digital signal. The systems illustrated in FIGS. 1A-1D and 6-9 suitably may be modified to omit the chirped optical source (e.g., MLL and chirped FBG) and optical modulator (e.g., MZM), and may be configured to accept such an optical digital signal from a corresponding source (not illustrated). The segmenter, replicator, and mixer may operate on the optical digital signal in substantially the same manner as described above. For example, the optical digital signal may be segmented into N segments in the manner illustrated in FIG. 10B. In this example, the segments are ordered $\lambda_n > \lambda_{n-1} > \ldots > \lambda_7 > \lambda_6 > \lambda_5 > \lambda_4 > \lambda_3 > \lambda_2 > \lambda_1$, although it should be understood that any suitable sequence of segments may be provided.

Figure 11:
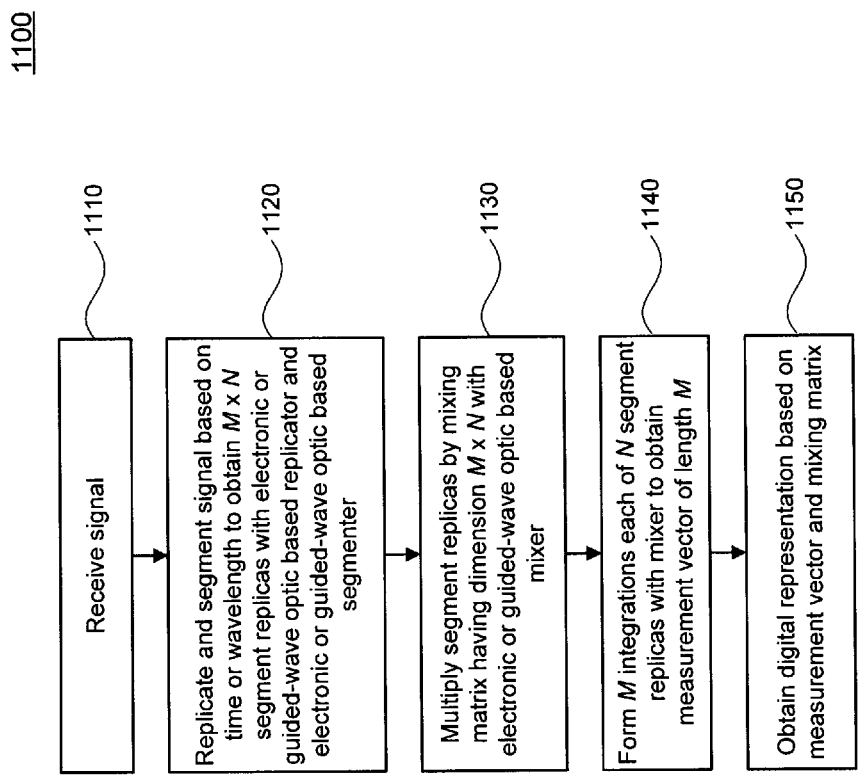
FIG. 11 illustrates steps in an exemplary method for obtaining a digital representation of a signal, according to some embodiments of the present invention.

FIG. 11 illustrates an exemplary method 1100 for obtaining a digital representation of a signal, according to some embodiments of the present invention. First, at step 1110, a wideband signal is received. The signal may be a radio-frequency signal, which may be analog or digital, or an optical digital signal, and may reside on a periodically chirped optical carrier. The signal may be received in a manner such as discussed above with respect to FIGS. 1A-1D and FIGS. 10A-10B. For example, an optical-domain representation of the received signal may be obtained by imposing the signal on a periodically chirped optical carrier, e.g., in the form of an intensity modulation of the carrier. Such a modulation of the optical carrier may be considered to provide an optical-domain representation of the received signal. Or, for example, as described above with reference to FIG. 10, the received signal may be an optical digital signal. In such an embodiment, the received signal is already in the optical domain and may be used "as is," in which case no action need be taken to obtain an optical-domain representation of the received signal.

At step 1120, the signal is replicated and segmented based on time or wavelength to obtain M×N segment replicas. Preferably, such replication and segmentation respectively is performed using an electronic or guided-wave optic based replicator and an electronic or guided-wave optic based segmenter. As noted above, such a replicator and segmenter may be provided in any suitable arrangement, and also may have additional functionalities (such as that of a mixer). The resulting segment replicas may be in the optical domain, or may be in the electronic domain.

At step 1130, the segment replicas are multiplied by a mixing matrix having dimension M×N with an electronic or guided-wave optic based mixer. As described above, the mixer may have any suitable number of elements configured to individually transmit, reflect, absorb, or block the segmented replicas and thus to impose elements of the mixing matrix onto corresponding segment replicas.

At step 1140, M integrations each of N of the segment replicas is formed with the mixer so as to obtain a measurement vector of length M. At step 1150, a digital representation of the originally received signal then is obtained based on the measurement vector and the mixing matrix. Such processing may include using a dedicated circuit or a computer. The processing may include running a suitable program for signal recovery in software such as Matlab® (The MathWorks, Inc., Natick, Mass.) or Mathematica® (Wolfram Research, Champaign, Ill.).

Once the digital representation of the signal is obtained, it may be suitably analyzed. For example, a modulation format of the digital representation may be determined, e.g., using suitable computer software. Non-limiting examples of modulation formats include amplitude modulation, double-sideband modulation, single-sideband modulation, vestigial sideband modulation, quadrature amplitude modulation, angle modulation, frequency modulation, phase modulation, phase-shift keying, binary phase modulation, frequency-shift keying, amplitude shift-keying, on/off keying, continuous phase modulation, orthogonal frequency-division multiplexing modulation, wavelet modulation, Trellis coded modulation, direct-sequence spread spectrum, chirp spread spectrum, frequency-hopping spread spectrum, and pulse position modulation. Previously-known demodulation techniques may require prior knowledge of the type of modulation used to encode a signal; for example, previously-known demodulation phase-shift keying may require the use of an interferometer to determine the phase of incoming optical pulses. By contrast, aspects of the present invention instead provide a digitized representation of the received signal to suitable software that may be configured to determine the particular type of modulation being used to encode a signal, thus providing substantially more flexibility than previously-known demodulators. The digital representation may be demodulated based on the modulation format using, e.g., suitable computer software. The digital representation of the received signal may be displayed to a user, e.g., using a suitable display device, such as an LCD or LED display.

While preferred embodiments of the invention are described herein, it will be apparent to one skilled in the art that various changes and modifications may be made. For example, it should be apparent that the systems and methods provided herein suitably may be used to obtain representations of any received signal, including wideband signals, in applications including, but not limited to, signals intelligence, software-defined radio, wideband radar, ultra-wideband RF communications, demodulation for optical communications systems with higher order modulation formats, and test and measurement systems such as high speed digital oscilloscopes. The appended claims are intended to cover all such changes and modifications that fall within the true spirit and scope of the invention.

What is claimed:

1. A system for obtaining a digital representation of a received signal, the system comprising:
    an electronic or guided-wave optic based replicator configured to obtain M replicas of a signal applied thereto;
    an electronic or guided-wave optic based segmenter configured to segment a signal applied thereto into N segments based on time or wavelength,
    the replicator and the segmenter together configured to obtain M×N segment replicas of the received signal;
    an electronic or guided-wave optic based mixer configured to multiply the M×N segment replicas by coefficients of a mixing matrix having dimension M×N and, after the multiplication, to form M integrations each of N of the segment replicas so as to obtain a measurement vector of length M;
    a signal recovery processor configured to obtain a digital representation of the received signal based on the measurement vector and the mixing matrix;
    a chirped optical source configured to generate a chirped, repetitively pulsed, optical signal; and
    an optical modulator configured to modulate the optical signal based on the received signal,
    wherein the segmenter comprises a guided-wave optic based wavelength division demultiplexer having dimension 1×N and being configured to receive the modulated optical signal and to segment the modulated optical signal into the N segments based on wavelength.

2. The system of claim 1, wherein the replicator comprises N guided-wave optic based splitters each having dimension 1×M and each being configured to receive one of the N segments of the optical signal from the wavelength division demultiplexer and to output M replicas of that segment.

3. The system of claim 2, wherein the mixer comprises M×N guided-wave optic based attenuators, each configured to receive one of the M×N segment replicas from a corresponding splitter and to multiply that segment replica by an element of the mixing matrix by either substantially transmitting that segment replica or by substantially reflecting or absorbing that segment replica.

4. The system of claim 3, wherein the mixer further comprises M wavelength division multiplexers each having dimension N×1 and each being configured to receive and to integrate N of the segment replicas from N corresponding attenuators and to output a corresponding one of the M elements of the measurement vector.

5. The system of claim 4, wherein the signal recovery processor comprises:
  M photodetectors, each configured to receive one of the M elements of the measurement vector from a corresponding wavelength division multiplexer and to output an electronic representation of that element; and
  M analog-to-digital converters, each configured to receive one of the electronic representations of one of the M elements of the measurement vector from a corresponding photodetector and to output a digital representation of that element.

6. The system of claim 1, wherein the replicator comprises:
  N photodiodes, each configured to receive one of the N segments of the optical signal from the wavelength division demultiplexer and to output an electronic representation of the segment; and
  N electronic based splitters, each configured to receive one of the electronic representations of the segments and to output M replicas of that electronic representation of the segment.

7. The system of claim 6, wherein the mixer comprises an electronic based switch configured to multiply each of the M×N segment replicas by a corresponding element of the mixing matrix by either substantially transmitting or substantially blocking that segment replica, the electronic switch comprising M output ports each receiving and integrating N of the segment replicas following multiplication and outputting one of the M elements of the measurement vector.

8. The system of claim 7, wherein the signal recovery processor comprises M analog-to-digital converters, each configured to receive one of the M elements of the measurement vector from a corresponding one of the M output ports and to output a digital representation of that element.

9. A system for obtaining a digital representation of a received signal, the system comprising:
  an electronic or guided-wave optic based replicator configured to obtain M replicas of a signal applied thereto;
  an electronic or guided-wave optic based segmenter configured to segment a signal applied thereto into N segments based on time or wavelength,
  the replicator and the segmenter together configured to obtain M×N segment replicas of the received signal;
  an electronic or guided-wave optic based mixer configured to multiply the M×N segment replicas by coefficients of a mixing matrix having dimension M×N and, after the multiplication, to form M integrations each of N of the segment replicas so as to obtain a measurement vector of length M;
  a signal recovery processor configured to obtain a digital representation of the received signal based on the measurement vector and the mixing matrix;
  a chirped optical source configured to generate a chirped, repetitively pulsed, optical signal; and
  an optical modulator configured to modulate the optical signal based on the received signal,
  wherein the replicator comprises a guided-wave optic based splitter having dimension 1×M and being configured to receive the modulated optical signal and to generate M replicas of the modulated optical signal, and
  wherein the segmenter comprises M×N fiber Bragg grating (FBGs) arranged in M units each having N FBGs, each unit being configured to receive one of the M replicas of the modulated optical signal, each FBG in the unit being tuned to a different wavelength of light than each other FBG in the unit so as to segment the received one of the M replicas into N segment replicas based on wavelength.

10. The system of claim 9, wherein the mixer comprises a first subset of the M×N FBGs being configured to substantially reflect the wavelengths to which those FBGs are tuned and a second subset of the M×N FBGs being configured to substantially transmit the wavelengths to which those FBGs are tuned so as to multiply the M×N segment replicas by the mixing matrix.

11. The system of claim 10, wherein the mixer comprises:
  2M photodetectors, a pair of the photodetectors being associated with each of the M units, a first photodetector of the pair being configured to receive light transmitted by the FBGs of the unit and to convert the received light into a first electronic signal, a second photodiode of the pair being configured to receive light reflected by the FBGs of the unit and to convert the received light into a second electronic signal; and
  M electronic based integration circuits, each associated with a corresponding one of the M units and configured to receive the first and second electronic signals from the corresponding pair of photodetectors associated with that unit and to output a corresponding one of the M elements of the measurement vector based on the first and second electronic signals.

12. The system of claim 11, wherein the signal recovery processor comprises M analog-to-digital converters, each associated with one of the M units and configured to receive a corresponding one of the M elements of the measurement vector from the integration circuit associated with that unit and to output a digital representation of that element.

13. The system of claim 10, wherein the mixer comprises M photodetectors, each associated with a corresponding one of the M units and configured to receive light transmitted by or reflected by the FBGs of the unit and to convert the received light into a corresponding one of the M elements of the measurement vector.

14. The system of claim 13, wherein the signal recovery processor comprises M analog-to-digital converters, each associated with a corresponding one of the M units and configured to receive the corresponding element of the measurement vector from the photodetector associated with that unit and to output a digital representation of that element.

15. The system of claim 10, wherein the chirp of the optical source is selected so as to offset timing delays generated by the M×N FBGs.

16. The system of claim 10, wherein the mixer further comprises additional FBGs configured to offset timing delays generated by the M×N FBGs.

17. The system of claim 1, wherein the received signal comprises an analog radio-frequency signal.

18. The system of claim 1, wherein the received signal comprises an optical digital signal.

19. A method for obtaining a digital representation of a received signal, the method comprising:
  replicating and segmenting the received signal based on time or wavelength to obtain M×N segment replicas with an electronic or guided-wave optic based replicator and an electronic or guided-wave optic based segmenter;

multiplying the M×N segmented replicas by a mixing matrix having dimension M×N with an electronic or guided-wave optic based mixer;

after the multiplication, forming M integrations each of N of the segment replicas so as to obtain a measurement vector of length M with the mixer;

obtaining a digital representation of the received signal based on the measurement vector and the mixing matrix;

generating a chirped, repetitively pulsed, optical signal; and modulating the optical signal based on the received signal, wherein the segmenter comprises a guided-wave optic based wavelength division demultiplexer having dimension 1×N and being configured to receive the modulated optical signal and to segment the modulated optical signal into the N segments based on wavelength.

20. A method for obtaining a digital representation of a received signal, the method comprising:

replicating and segmenting the received signal based on time or wavelength to obtain M×N segment replicas with an electronic or guided-wave optic based replicator and an electronic or guided-wave optic based segmenter;

multiplying the M×N segmented replicas by a mixing matrix having dimension M×N with an electronic or guided-wave optic based mixer;

after the multiplication, forming M integrations each of N of the segment replicas so as to obtain a measurement vector of length M with the mixer;

obtaining a digital representation of the received signal based on the measurement vector and the mixing matrix generating a chirped, repetitively pulsed, optical signal; and modulating the optical signal based on the received signal, wherein the replicator comprises a guided-wave optic based splitter having dimension 1×M and being configured to receive the modulated optical signal and to generate M replicas of the modulated optical signal, and wherein the segmenter comprises M×N fiber Bragg grating (FBGs) arranged in M units each having N FBGs, each unit being configured to receive one of the M replicas of the modulated optical signal, each FBG in the unit being tuned to a different wavelength of light than each other FBG in the unit so as to segment the received one of the M replicas into N segment replicas based on wavelength.

* * * * *